US012765419B2

(12) United States Patent
Son et al.

(10) Patent No.: US 12,765,419 B2
(45) Date of Patent: Oct. 13, 2026

(54) DISPLAY DEVICE AND METHOD OF MANUFACTURING THE SAME

(71) Applicant: LG Display Co., Ltd., Seoul (KR)

(72) Inventors: Hyeon Ho Son, Goyang-si (KR); Hyung Ju Park, Goyang-si (KR); Bo Gyun Chung, Goyang-si (KR); Do Jin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 635 days.

(21) Appl. No.: 18/115,205

(22) Filed: Feb. 28, 2023

(65) Prior Publication Data

US 2024/0213227 A1 Jun. 27, 2024

(30) Foreign Application Priority Data

Dec. 28, 2021 (KR) ........................ 10-2021-0189938
Dec. 27, 2022 (KR) ........................ 10-2022-0185580

(51) Int. Cl.
*H10W 90/00* (2026.01)
*H10H 20/01* (2025.01)

(52) U.S. Cl.
CPC ............ *H10W 90/00* (2026.01); *H10H 20/01* (2025.01)

(58) Field of Classification Search
None
See application file for complete search history.

(56) References Cited

U.S. PATENT DOCUMENTS

| | | | | |
|---|---|---|---|---|
| 2018/0174519 | A1* | 6/2018 | Kim | G09G 3/3233 |
| 2018/0342691 | A1* | 11/2018 | Lu | H10H 20/852 |
| 2019/0164946 | A1* | 5/2019 | Fu | H10W 90/00 |
| 2019/0181301 | A1* | 6/2019 | Kim | H10H 20/84 |
| 2021/0384388 | A1* | 12/2021 | Cha | H10H 29/142 |
| 2022/0149228 | A1* | 5/2022 | Akimoto | H10H 20/01335 |

FOREIGN PATENT DOCUMENTS

KR 10-2020-0111012 A 9/2020

* cited by examiner

*Primary Examiner* — Benjamin P Sandvik
(74) *Attorney, Agent, or Firm* — Birch, Stewart, Kolasch & Birch, LLP

(57) ABSTRACT

A method of manufacturing a display device according to an embodiment of the present disclosure can include placing a mask on an adhesive layer of a display panel and irradiating light thereon, and transferring a plurality of light emitting diodes on a donor onto the display panel. The adhesive layer can be configured by a plurality of first parts overlapping the mask and a second part which is exposed from the mask to be irradiated with light. Further, a light emitting diode alone which is in contact with the plurality of first parts can be transferred onto the display panel.

19 Claims, 24 Drawing Sheets

DISPLAY DEVICE AND METHOD OF MANUFACTURING THE SAME

CROSS-REFERENCE TO RELATED APPLICATIONS

This application claims priority to Korean Patent Application No. 10-2021-0189938 filed on Dec. 28, 2021 in the Republic of Korea, and Korean Patent Application No. 10-2022-0185580 filed on Dec. 27, 2022 in the Republic of Korea, the entire contents of all these applications being hereby expressly incorporated by reference into the present application.

BACKGROUND OF THE DISCLOSURE

Field

The present disclosure relates to a display device and a method of manufacturing the same, and more particularly to, a display device using a light emitting diode (LED) and a method of manufacturing the same.

Discussion of the Related Art

As display devices are used as a monitor of a computer, a television, or a cellular phone, there are an organic light emitting display device (OLED) which is a self-emitting device and a liquid crystal display device (LCD) which requires a separate light source.

An applicable range of the display device is diversified and can cover personal digital assistants as well as monitors of computers and televisions and other devices, and a display device with a large display area and a reduced volume and weight is being studied.

Further, a display device including a light emitting diode (LED) is attracting attention as the next generation display device. Since the LED is formed of an inorganic material, rather than an organic material, reliability is excellent so that a lifespan thereof is longer than that of the liquid crystal display device or the organic light emitting display device. Further, the LED has a fast lighting speed, excellent luminous efficiency, and a strong impact resistance so that stability is excellent and an image having a high luminance can be displayed.

SUMMARY OF THE DISCLOSURE

An object to be achieved by the present disclosure is to provide a display device in which only a part of an adhesive layer in an area to which a light emitting diode is transferred during a transfer process has an adhesiveness and a method of manufacturing the display device.

Another object to be achieved by the present disclosure is to provide a display device in which a part of an adhesive layer corresponding to a light emitting diode has an improved adhesiveness and a method of manufacturing the display device.

Still another object to be achieved by the present disclosure is to provide a display device in which some light emitting diodes among a plurality of light emitting diodes on a donor are selectively transferred in an area corresponding to a sub pixel and a method of manufacturing the display device.

Still another object to be achieved by the present disclosure is to provide a display device in which a transfer process is simplified and a process time is reduced and a method of manufacturing the display device.

Still another object to be achieved by the present disclosure is to provide a display device in which a plurality of number of times of transfer processes with one donor is continuously performed and a method of manufacturing the display device.

Objects of the present disclosure are not limited to the above-mentioned objects, and other objects, which are not mentioned above, can be clearly understood by those skilled in the art from the following descriptions.

According to an aspect of the present disclosure, a display device includes a substrate in which each pixel including a plurality of sub pixels is defined, an adhesive layer disposed on the substrate; and a plurality of light emitting diodes disposed on the adhesive layer in each of the plurality of sub pixels, and the adhesive layer is configured by a plurality of first parts overlapping the plurality of light emitting diodes and a second part which is a remaining part excluding the plurality of first parts. Accordingly, the first part of the adhesive layer overlapping the light emitting diode and the second part which does not overlap the light emitting diode are controlled to have different adhesiveness so that the light emitting diode can be easily fixed.

According to another aspect of the present disclosure, a method of manufacturing a display device includes transferring a plurality of light emitting diodes on a wafer onto a donor, placing a mask on an adhesive layer of a display panel and irradiating light thereon; and transferring the plurality of light emitting diodes on the donor onto the display panel, and the adhesive layer is configured by a plurality of first parts overlapping the mask and a second part which is exposed from the mask to be irradiated with light and only a light emitting diode which is in contact with the plurality of first parts, among the plurality of light emitting diodes, can be transferred onto the display panel. An adhesiveness of the second part which does not overlap the sub pixel is removed to selectively transfer the light emitting diode only onto the first part of the sub pixel to simplify the transfer process.

Other detailed matters of the exemplary embodiments are included in the detailed description and the drawings.

According to the present disclosure, only a first part of an adhesive layer which overlaps a light emitting diode has an adhesiveness so that only some light emitting diodes among a plurality of light emitting diodes are selectively transferred into a sub pixel array.

According to the present disclosure, an adhesiveness of a first part of an adhesive layer corresponding to a light emitting diode is improved to minimize the transfer defect.

According to the present disclosure, a plurality of number of times of transfer processes is continuously performed with one donor so that the number of times of transfer processes of transferring a light emitting diode from a wafer onto a donor and a process time can be reduced.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
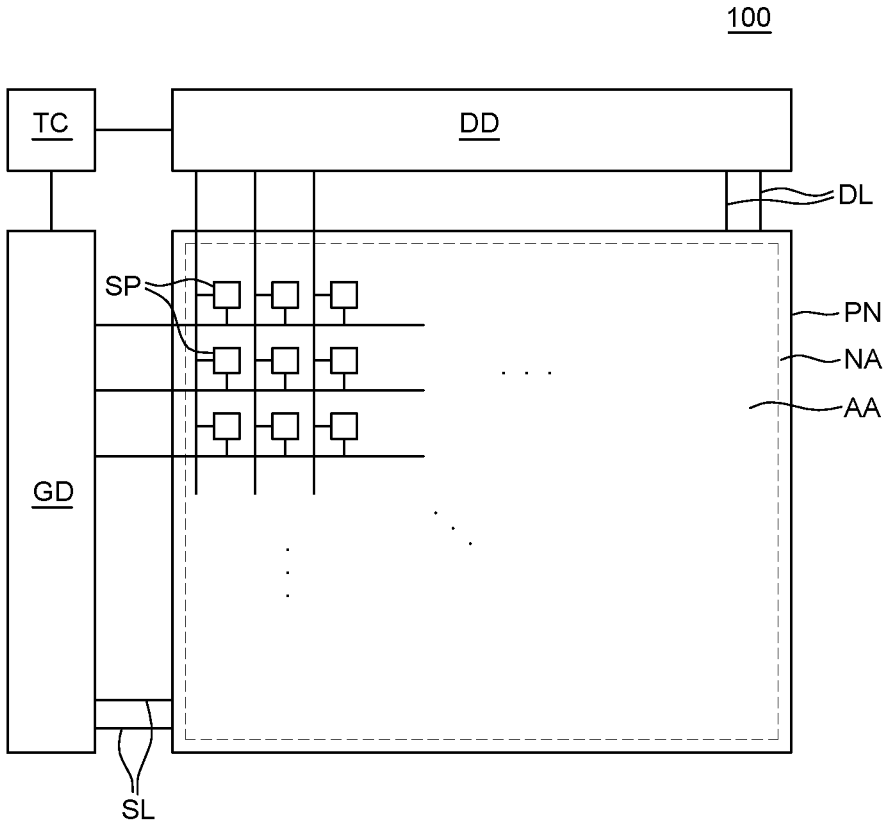
FIG. 1 is a schematic diagram of a display device according to an exemplary embodiment of the present disclosure.

Advantages and characteristics of the present disclosure, and a method of achieving the advantages and characteristics will be clear by referring to exemplary embodiments described below in detail together with the accompanying drawings. However, the present disclosure is not limited to exemplary embodiments disclosed herein but will be implemented in various forms. Only these embodiments are provided to make the disclosure of this specification complete, and to fully inform those skilled in the art of the scope of the specification to which this specification belongs.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies can be omitted to avoid unnecessarily obscuring the subject matter of the present disclosure. The terms such as "including," and "having" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", "under", and "next", one or more parts can be positioned between the two parts unless the terms are used with the term "immediately" or "directly".

When an element or layer is disposed "on" the other element or layer, another layer or another element can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings. All components of each display device according to all embodiments of the present disclosure are operatively coupled and configured.

FIG. 1 is a schematic diagram of a display device according to an exemplary embodiment of the present disclosure. In FIG. 1, for the convenience of description, among various components of a display device 100, a display panel PN, a gate driver GD, a data driver DD, and a timing controller TC are illustrated.

Referring to FIG. 1, the display device 100 includes the display panel PN including a plurality of sub pixels SP, the gate driver GD and the data driver DD which supply various signals to the display panel PN, and the timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC into a data voltage using a reference gamma voltage in accordance with a plurality of data control signals supplied from the timing controller TC. The data driver DD can supply the converted data voltage to the plurality of data lines DL.

The timing controller TC aligns image data input from the outside to supply the image data to the data driver DD. The timing controller TC can generate a gate control signal and a data control signal using synchronization signals input from the outside, such as a dot clock signal, a data enable signal, and horizontal/vertical synchronization signals. The timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP can be connected to the scan lines SL and the data lines DL, respectively. In addition, each of the plurality of sub pixels SP can be connected to a high potential power line, a low potential power line, a reference line, and the like.

In the display panel PN, an active area AA and the non-active area NA enclosing the active area AA can be defined.

The active area AA is an area in which images are displayed in the display device 100. In the active area AA, a plurality of sub pixels SP which configures a plurality of pixels PX and a circuit for driving the plurality of sub pixels SP can be disposed. The plurality of sub pixels SP is a minimum unit which configures the active area AA and n sub pixels SP form one pixel PX, where n can be a positive integer. In each of the plurality of sub pixels SP, a light emitting diode and a thin film transistor for driving the light emitting diode can be disposed. The plurality of light emitting diodes can be defined in different manners depending on the type of the display panel PN. For example, when the display panel PN is an inorganic light emitting display panel, the light emitting diode 120 can be a light emitting diode (LED) or a micro light emitting diode (LED).

In the active area AA, a plurality of signal lines which transmits various signals to the plurality of sub pixels SP is disposed. For example, the plurality of signal lines includes a plurality of data lines DL which supplies a data voltage to each of the plurality of sub pixels SP, a plurality of scan lines SL which supplies a gate voltage to each of the plurality of sub pixels SP, and the like. The plurality of scan lines SL extends from the active area AA in one direction to be connected to the plurality of sub pixels SP and the plurality of data lines DL extends from the active area AA in a direction different from the one direction to be connected to the plurality of sub pixels SP. In addition, in the active area AA, a low potential power line, a high potential power line, and the like can be further disposed, but it is not limited thereto.

The non-active area NA is an area where images are not displayed so that the non-active area NA can be defined as an area extending from the active area AA. In the non-active area NA, a link line which transmits a signal to the sub pixel SP of the active area AA, a pad electrode, a driving IC (integrated circuit), such as a gate driver IC or a data driver IC, or the like can be disposed.

In the meantime, the non-active area NA can be located on a rear surface of the display panel PN, for example, a surface on which the sub pixels SP are not disposed or can be omitted, and is not limited as illustrated in the drawing.

In the meantime, a driver, such as a gate driver GD, a data driver DD, and a timing controller TC, can be connected to the display panel PN in various ways. For example, the gate driver GD can be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board and can be electrically connected to the display panel PN by bonding the flexible film and the printed circuit board to a pad electrode formed in the non-active area NA of the display panel PN. If the gate driver GD is mounted in the GIP manner and the data driver DD and the timing controller TC transmit a signal to the display panel PN through a pad electrode of the non-active area NA, an area of the non-active area NA to dispose the gate driver GD and the pad electrode needs to be ensured. By doing this, a bezel can be increased.

In contrast, when the gate driver GD is mounted in the active area AA in the GIA manner and a side line SRL which connects the signal line on the front surface of the display panel PN to the pad electrode on a rear surface of the display panel PN is formed to bond the flexible film and the printed circuit board onto a rear surface of the display panel PN, the non-active area NA can be minimized on the front surface of the display panel PN. For example, when the gate driver GD, the data driver DD, and the timing controller TC are connected to the display panel PN as described above, a zero bezel in which there is no bezel can be substantially implemented, which will be described in more detail with reference to FIGS. 2A and 2B.

Figure 2A:
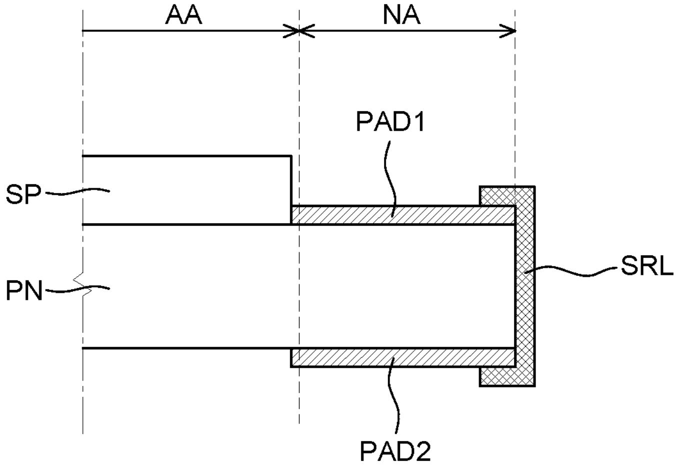
FIG. 2A is a partial cross-sectional view of a display device according to an exemplary embodiment of the present disclosure.
Figure 2B:
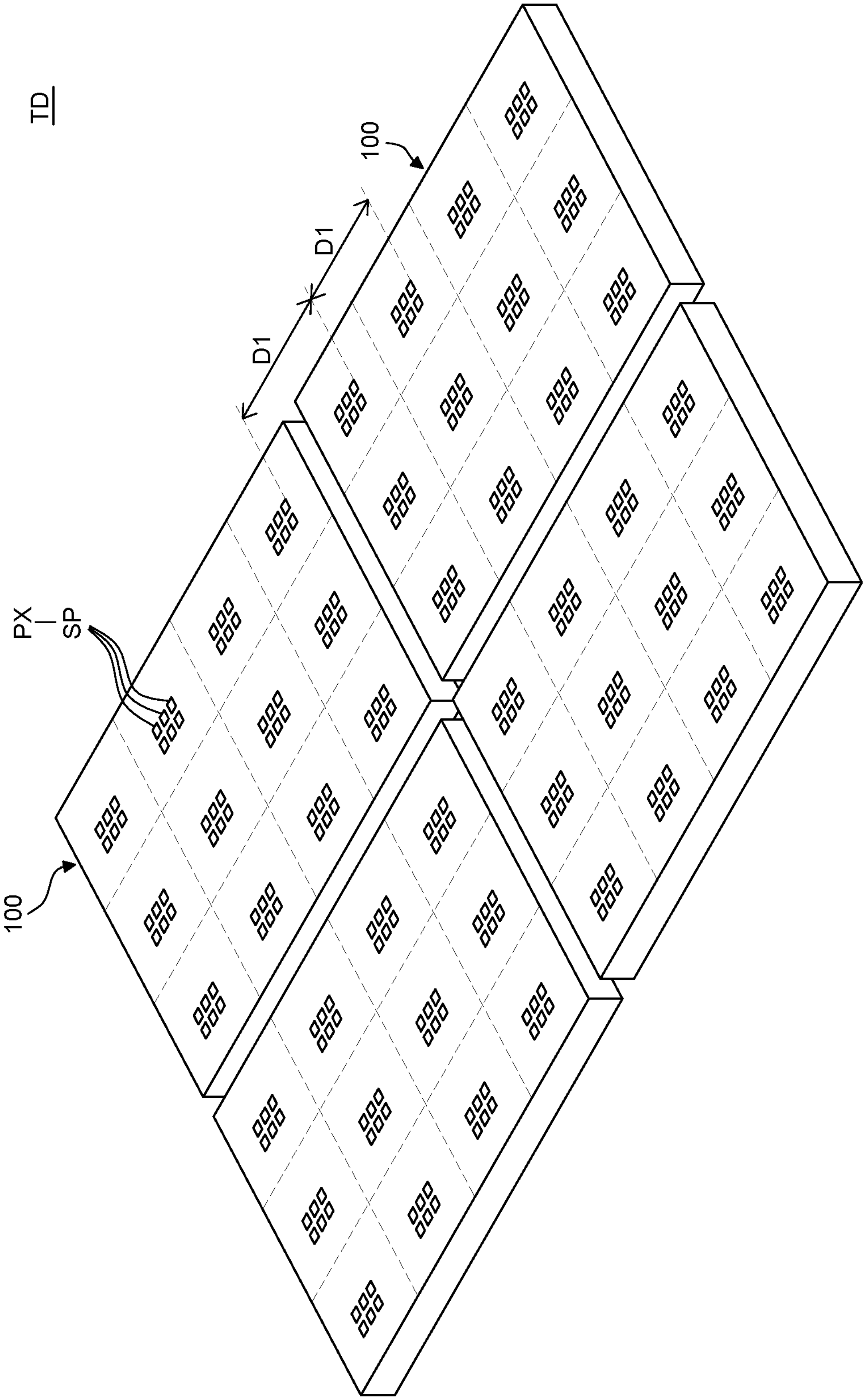
FIG. 2B is a perspective view of a tiling display device according to an exemplary embodiment of the present disclosure.

FIG. 2A is a partial cross-sectional view of a display device according to an exemplary embodiment of the present disclosure. FIG. 2B is a perspective view of a tiling display device according to an exemplary embodiment of the present disclosure.

Referring to FIG. 2A, in the non-active area NA of the display panel PN, a plurality of pad electrodes for transmitting various signals to the plurality of sub pixels SP is disposed. For example, in the non-active area NA of the front surface of the display panel PN, a first pad electrode PAD1 which transmits a signal to the plurality of sub pixels SP is disposed. In the non-active area NA of the rear surface of the display panel PN, a second pad electrode PAD2 which is electrically connected to a driving component, such as a flexible film and the printed circuit board, is disposed.

In this case, various signal lines connected to the plurality of sub pixels SP, for example, a scan line SL or a data line DL extends from the active area AA to the non-active area NA to be electrically connected to the first pad electrode PAD1.

The side line SRL is disposed along a side surface of the display panel PN. The side line SRL can electrically connect a first pad electrode PAD1 on the front surface of the display panel PN and a second pad electrode PAD2 on the rear surface of the display panel PN. Therefore, a signal from a driving component on the rear surface of the display panel PN can be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA of the display panel PN.

Referring to FIG. 2B, a tiling display device TD having a large screen size can be implemented by connecting a plurality of display devices 100. At this time, as illustrated in FIG. 2A, when the tiling display device TD is implemented using a display device 100 with a minimized bezel, a seam area in which an image between the display devices 100 is not displayed is minimized so that a display quality can be improved.

For example, the plurality of sub pixels SP can form one pixel PX and a distance D1 between an outermost pixel PX of one display device 100 and an outermost pixel PX of another display device 100 adjacent to one display device can be implemented to be equal to a distance D1 between pixels PX in one display device 100. Accordingly, the distance between pixels PX between the display devices 100 is constantly configured to minimize the seam area.

However, FIGS. 2A and 2B are illustrative so that the display device 100 according to the exemplary embodiment of the present disclosure can be a general display device with a bezel, but is not limited thereto.

Figure 3A:
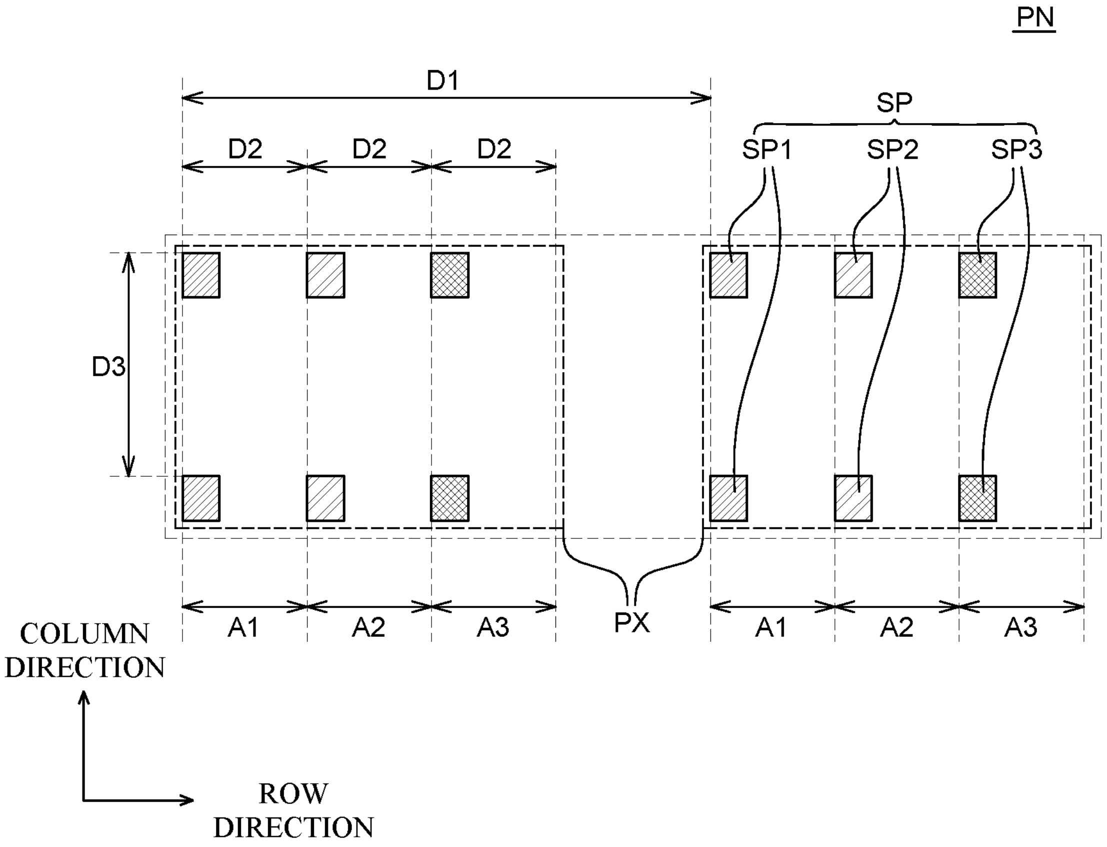
FIG. 3A is an enlarged plan view of a display device according to an exemplary embodiment of the present disclosure.
Figure 3B:
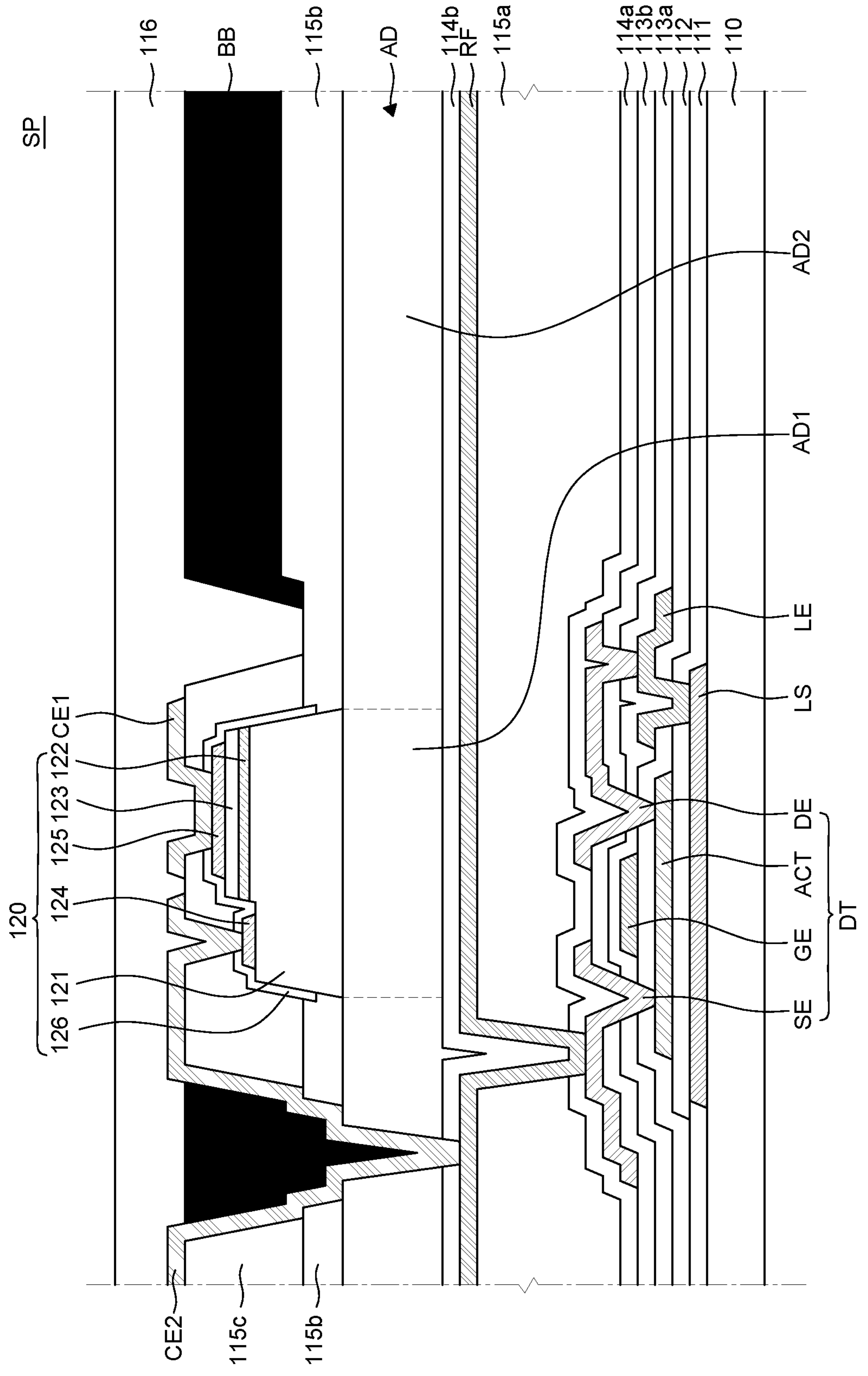
FIG. 3B is a cross-sectional view of a display device according to an exemplary embodiment of the present disclosure.

FIG. 3A is an enlarged plan view of a display device according to an exemplary embodiment of the present disclosure. FIG. 3B is a cross-sectional view of a display device according to an exemplary embodiment of the present disclosure.

First, referring to FIG. 3A, the display panel PN includes a plurality of pixels PX which is formed by a plurality of sub pixels SP. Each of the plurality of sub pixels SP includes a light emitting diode 120 and a pixel circuit to independently emit light. For example, the first sub pixel SP1 is a red sub pixel, the second sub pixel SP2 is a green sub pixel, and the third sub pixel SP3 is a blue sub pixel, but it is not limited thereto.

One pixel PX can include one or more first sub pixels SP1, one or more second sub pixels SP2, and one or more third sub pixels SP3. For example, one pixel PX can include two first sub pixels SP1, two second sub pixels SP2, and two third sub pixels SP3.

Hereinafter, it is described by assuming that one pixel PX includes one pair of first sub pixels SP1, one pair of second sub pixels SP2, and one pair of third sub pixels SP3, but the configuration of the pixel PX is not limited thereto.

A plurality of sub pixels SP included in one pixel PX can be disposed by forming one pair of rows. For example, one first sub pixel SP1, one second sub pixel SP2, and one third sub pixel SP3 can be sequentially disposed in a first row and the remaining first sub pixel SP1, the remaining second sub pixel SP2, and the remaining third sub pixel SP3 can be sequentially disposed in a second row.

Only one type of sub pixel SP can be disposed in one column. For example, in one pixel PX, only the first sub pixel SP1 can be disposed in the first column, only the second sub pixel SP2 can be disposed in the second column, and only the third sub pixel SP3 can be disposed in the third column. An area corresponding to a column in which the first sub pixel SP1 is disposed can be defined as a first area A1, an area corresponding to a column in which the second sub pixel SP2 is disposed can be defined as a second area A2, and an area corresponding to a column in which the third sub pixel SP3 is disposed can be defined as a third area A3.

The plurality of pixels PX can be disposed in the row direction with an equal interval. For example, the plurality of pixels PX can be disposed in the row direction with an interval corresponding to a first distance D1. For example, a pitch of the pixel PX can be a first distance D1. Further, the plurality of pixels PX can be also disposed in a column direction with an equal interval.

Sub pixels SP disposed in the same row in one pixel PX can be disposed with an equal interval. For example, the sub pixels SP disposed in the same row in one pixel PX can be disposed with an interval corresponding to a second distance D2. In other words, widths of each of the plurality of first areas A1, the plurality of second areas A2, and the plurality of third areas A3 can be a second distance D2. The sub pixels SP disposed in the same column in one pixel PX can be disposed with an interval corresponding to a third distance D3.

Next, referring to FIG. 3B, in each of the plurality of sub pixels SP of the display panel PN of the display device 100 according to the exemplary embodiment of the present disclosure, a substrate 110, a buffer layer 111, a gate insulating layer 112, a first interlayer insulating layer 113*a*, a second interlayer insulating layer 113*b*, a first passivation layer 114*a*, a first planarization layer 115*a*, a second passivation layer 114*b*, an adhesive layer AD, a second planarization layer 115*b*, a third planarization layer 115*c*, a protection layer 116, a bank BB, a driving transistor DT, a light emitting diode 120, a reflection layer RF, a first connection electrode CE1, a second connection electrode CE2, a light shielding layer LS, and an auxiliary electrode LE.

First, the substrate 110 is a component for supporting various components included in the display device 100 and can be formed of an insulating material. For example, the substrate 110 can be formed of glass or resin. Further, the substrate 110 can be configured to include polymer or plastics or can be formed of a material having flexibility.

The light shielding layer LS is disposed in each of the plurality of sub pixels SP on the substrate 110. The light shielding layer LS blocks light incident onto an active layer ACT of the driving transistor DT to be described below, below the substrate 110. Light which is incident onto the active layer ACT of the driving transistor DT is blocked by the light shielding layer LS to minimize a leakage current.

The buffer layer 111 is disposed on the substrate 110 and the light shielding layer LS. The buffer layer 111 can reduce permeation of moisture or impurities through the substrate 110. The buffer layer 111 can be configured by a single layer or a double layer of silicon oxide SiOx or silicon nitride SiNx, but is not limited thereto. However, the buffer layer 111 can be omitted depending on a type of substrate 110 or a type of transistor, but is not limited thereto.

The driving transistor DT is disposed on the buffer layer 111. The driving transistor DT includes an active layer ACT, a gate electrode GE, a source electrode SE, and a drain electrode DE.

The active layer ACT is disposed on the buffer layer 111. The active layer ACT can be formed of a semiconductor material, such as an oxide semiconductor, amorphous silicon, or polysilicon, but is not limited thereto.

The gate insulating layer 112 is disposed on the active layer ACT. The gate insulating layer 112 is an insulating layer which insulates the active layer ACT from the gate electrode GE and can be configured by a single layer or a double layer of silicon oxide SiOx or silicon nitride SiNx, but is not limited thereto.

The gate electrode GE is disposed on the gate insulating layer 112. The gate electrode GE can be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the gate electrode GE. In the first interlayer insulating layer 113*a* and the second interlayer insulating layer 113*b*, a contact hole through which the source electrode SE and the drain electrode DE are connected to the active layer ACT, respectively, is formed. The first interlayer insulating layer 113*a* and the second interlayer insulating layer 113*b* are insulating layers for protecting a component below the first interlayer insulating layer 113*a* and the second interlayer insulating layer 113*b* and can be configured by a single layer or a double layer of silicon oxide SiOx or silicon nitride SiNx, but are not limited thereto.

The source electrode SE and the drain electrode DE which are electrically connected to the active layer ACT are disposed on the second interlayer insulating layer 113*b*. The source electrode SE and the drain electrode DE can be configured by a conductive material, such as copper (Cu), aluminum (Al), molybdenum (Mo), nickel (Ni), titanium (Ti), chrome (Cr), or an alloy thereof, but are not limited thereto.

In the meantime, in the present specification, it is described that the first interlayer insulating layer 113*a* and the second interlayer insulating layer 113*b*, for example, a plurality of insulating layers is disposed between the gate electrode GE and the source electrode SE and the drain electrode DE. However, only one insulating layer can be disposed between the gate electrode GE and the source electrode SE and the drain electrode DE, but is not limited thereto.

As illustrated in the drawings, when a plurality of insulating layers, such as the first interlayer insulating layer 113*a* and the second interlayer insulating layer 113*b*, is disposed between the gate electrode GE and the source electrode SE and the drain electrode DE, an electrode can be further formed between the first interlayer insulating layer 113*a* and the second interlayer insulating layer 113*b*. The additionally formed electrode can form a capacitor with the other configuration disposed below the first interlayer insulating layer 113*a* or above the second interlayer insulating layer 113*b*.

The auxiliary electrode LE is disposed on the gate insulating layer 112. The auxiliary electrode LE is an electrode which electrically connects the light shielding layer LS below the buffer layer 111 to any one of the source electrode SE and the drain electrode DE on the second interlayer insulating layer 113*b*. For example, the light shielding layer LS is electrically connected to any one of the source electrode SE or the drain electrode DE through the auxiliary electrode LE so as not to operate as a floating gate. Therefore, fluctuation of a threshold voltage of the driving transistor DT caused by the floated light shielding layer LS can be minimized. Even though in the drawing, the light shielding layer LS is connected to the drain electrode DE, the light shielding layer LS can also be connected to the source electrode SE, but is not limited thereto.

The first passivation layer 114*a* is disposed on the driving transistor DT. The first passivation layer 114*a* is an insulating layer which protects components below the first passivation layer 114*a* and can be configured by a single layer or a double layer of silicon oxide SiOx or silicon nitride SiNx, but is not limited thereto.

The first planarization layer 115*a* is disposed on the first passivation layer 114*a*. The first planarization layer 115*a* can planarize an upper portion of the substrate 110 on which the driving transistor DT is disposed. The first planarization layer 115*a* can be configured by a single layer or a double layer, and for example, can be formed of photoresist or an acrylic organic material, but is not limited thereto.

The reflection layer RF is disposed on the first planarization layer 115*a*. The reflection layer RF electrically can connect the light emitting diode 120 to the driving transistor DT and reflect light emitted from the light emitting diode 120 to the upper portion of the light emitting diode 120. The reflection layer RF is formed of a conductive material having excellent reflecting property to reflect light emitted from the light emitting diode 120 toward the upper portion of the light emitting diode 120.

The second passivation layer 114*b* is disposed on the reflection layer RF. The second passivation layer 114*b* is an insulating layer which protects components below the second passivation layer 114*b* and can be configured by a single layer or a double layer of silicon oxide SiOx or silicon nitride SiNx, but is not limited thereto.

The adhesive layer AD is disposed on the second passivation layer 114*b*. The adhesive layer AD is coated on the front surface of the substrate 110 to fix the light emitting diode 120 disposed on the adhesive layer AD. The adhesive layer AD can be formed of a photo curable adhesive material which is cured by light. For example, the adhesive layer AD can be formed of an acrylic material including a photoresist, but is not limited thereto. The adhesive layer AD can be formed on the front surface of the display panel PN excluding an area in which the pad electrode is disposed. For example, as illustrated in FIG. 2A, when the plurality of first pad electrodes PAD1 is formed on the front surface of the display panel PN, the adhesive layer AD can be formed in a remaining area excluding an area in which the first pad electrode PAD1 is formed.

The adhesive layer AD can be configured by a plurality of first parts AD1 overlapping the plurality of light emitting diodes 120 and a second part AD2 which is the remaining part excluding the plurality of first parts AD1. The second part AD2 of the adhesive layer AD is hardened before transferring the light emitting diode 120 onto the display panel PN and the plurality of first parts AD1 of the adhesive layer AD is hardened after transferring the light emitting diode 120 onto the display panel PN. The plurality of first parts AD1 and the second part AD2 of the adhesive layer AD are hardened at different timings to selectively transfer only a light emitting diode 120 overlapping the plurality of sub pixels SP, among the plurality of light emitting diodes 120 disposed on the donor, onto the display panel PN. A detailed description thereof will be made below with reference to FIGS. 4A to 4I.

The plurality of light emitting diodes 120 is disposed in each of the plurality of sub pixels SP on the adhesive layer AD. The plurality of light emitting diodes 120 is an element which emits light by a current and can include a light emitting diode 120 which emits red light, green light, and blue light and implement various colored light including white by a combination thereof. For example, the plurality of light emitting diodes 120 can be a light emitting diode (LED) or a micro LED, but is not limited thereto.

The light emitting diode 120 includes a first semiconductor layer 121, a light emitting layer 122, a second semiconductor layer 123, a first electrode 124, a second electrode 125, and an encapsulation layer 126.

The first semiconductor layer 121 is disposed on the adhesive layer AD and the second semiconductor layer 123 is disposed on the first semiconductor layer 121. The first semiconductor layer 121 and the second semiconductor layer 123 can be layers formed by doping n-type and p-type impurities into a specific material. For example, the first semiconductor layer 121 and the second semiconductor layer 123 can be layers doped with n type and p type impurities into a material such as gallium nitride (GaN), indium aluminum phosphide (InAlP), or gallium arsenide (GaAs). The p-type impurity can be magnesium (Mg), zinc (Zn), beryllium (Be), and the like, and the n-type impurity can be silicon (Si), germanium, tin (Sn), and the like, but are not limited thereto.

The light emitting layer 122 is disposed between the first semiconductor layer 121 and the second semiconductor layer 123. The light emitting layer 122 is supplied with holes and electrons from the first semiconductor layer 121 and the second semiconductor layer 123 to emit light. The light emitting layer 122 can be formed by a single layer or a multi-quantum well (MQW) structure, and for example, can be formed of indium gallium nitride (InGaN), gallium nitride (GaN), or the like, but is not limited thereto.

The first electrode 124 is disposed on the first semiconductor layer 121. The first electrode 124 is an electrode which electrically connects the driving transistor DT and the first semiconductor layer 121. The first electrode 124 can be disposed on an upper surface of the first semiconductor layer 121 which is exposed from the light emitting layer 122 and the second semiconductor layer 123. The first electrode 124 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu), or an alloy thereof, but is not limited thereto.

The second electrode 125 is disposed on the second semiconductor layer 123. The second electrode 125 can be disposed on the upper surface of the second semiconductor layer 123. The second electrode 125 is an electrode which electrically connects the power line and the second semiconductor layer 123. The second electrode 125 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu), or an alloy thereof, but is not limited thereto.

Next, the encapsulation layer 126 which encloses the first semiconductor layer 121, the light emitting layer 122, the second semiconductor layer 123, the first electrode 124, and the second electrode 125 is disposed. The encapsulation layer 126 is formed of an insulating material to protect the first semiconductor layer 121, the light emitting layer 122, and the second semiconductor layer 123. In the encapsulation layer 126, a contact hole which exposes the first electrode 124 and the second electrode 125 is formed to electrically connect the first connection electrode CE1 and the second connection layer CE2 to the first electrode 124 and the second electrode 125.

In the meantime, a part of the side surface of the first semiconductor layer 121 can be exposed from the encapsulation layer 126. The light emitting diode 120 manufactured on the wafer is separated from the wafer to be transferred onto the display panel PN. However, during the process of separating the light emitting diode 120 from the wafer, a part of the encapsulation layer 126 can be torn. For example, a part of the encapsulation layer 126 which is adjacent to a lower edge of the first semiconductor layer 121 of the light emitting diode 120 is torn during the process of separating the light emitting diode 120 from the wafer. Accordingly, a part of a lower side surface of the first semiconductor layer 121 can be exposed to the outside. However, even though the lower portion of the light emitting diode 120 is exposed from the encapsulation layer 126, the first connection electrode CE1 and the second connection electrode CE2 are formed after forming the second planarization layer 115*b* and the third planarization layer 115*c* which cover the side surface of the first semiconductor layer 121. Accordingly, a short defect can be reduced.

Next, the second planarization layer 115*b* and the third planarization layer 115*c* are disposed on the adhesive layer AD and the light emitting diode 120. The second planarization layer 115*b* overlaps a part of side surfaces of the plurality of light emitting diodes 120 to fix and protect the plurality of light emitting diodes 120. The third planarization layer 115*c* is formed to cover upper side portions of the second planarization layer 115*b* and the light emitting diode 120 and a contact hole which exposes the first electrode 124 and the second electrode 125 of the light emitting diode 120 can be formed. The first electrode 124 and the second electrode 125 of the light emitting diode 120 are exposed from the third planarization layer 115*c* and the third planarization layer 115*c* is partially disposed in an area between the first electrode 124 and the second electrode 125 to reduce a short defect. The second planarization layer 115*b* and the third planarization layer 115*c* can be configured by a single layer or a double layer, and for example, can be formed of photoresist or an acrylic organic material, but is not limited thereto. Even though in the specification, it is described that the second planarization layer 115*b* and the third planarization layer 115*c* are disposed, the planarization layer can be formed by a single layer, but is not limited thereto.

In the meantime, the third planarization layer 115*c* can cover only the light emitting diode 120 and an area adjacent to the light emitting diode 120. The third planarization layer 115*c* can be formed only in an area in which the bank BB is not formed. The third planarization layer 115*c* is disposed in an area of the sub pixel SP enclosed by the bank BB and can be disposed in an island shape. The bank BB can be disposed in a part of the upper surface of the second planarization layer 115*b* and the third planarization layer 115*c* can be disposed in the other part of the upper surface of the second planarization layer 115*b*.

The first connection electrode CE1 and the second connection electrode CE2 are disposed on the third planarization layer 115*c*. The first connection electrode CE1 is an electrode which electrically connects the second electrode 125 of the light emitting diode 120 and the power line. The first connection electrode CE1 can be electrically connected to the second electrode 125 of the light emitting diode 120 through a contact hole formed in the third planarization layer 115*c*.

The second connection electrode CE2 is an electrode which electrically connects the first electrode 124 of the light emitting diode 120 and the driving transistor DT. The second connection electrode CE2 can be connected to the reflection layer RF of each of the plurality of sub pixels SP through contact holes formed in the third planarization layer 115*c*, the second planarization layer 115*b*, the adhesive layer AD, and the second passivation layer 114*b*. At this time, the reflection layer RF is also connected to the source electrode SE of the driving transistor DT so that the source electrode SE of the driving transistor DT and the first electrode 124 of the light emitting diode 120 can be electrically connected by means of the reflection layer RF and the second connection electrode CE2.

In the meantime, even though in the drawing, it is illustrated that the first electrode 124, the second connection electrode CE2, and the reflection layer RF are electrically connected to the source electrode SE of the driving transistor DT, the first electrode 124, the second connection electrode CE2, and the reflection layer RF can be connected to the drain electrode DE of the driving transistor DT. However, it is not limited thereto.

The bank BB is disposed on the first connection electrode CE1, the second connection electrode CE2, and the second planarization layer 115*b* exposed from the third planarization layer 115*c*. The bank BB can be disposed to be spaced apart from the light emitting diode 120 with a predetermined interval. For example, the bank BB can be disposed on the second planarization layer 115*b* with a predetermined interval from the light emitting diode 120 or cover a part of the second connection electrode CE2 formed in the contact holes of the third planarization layer 115*c* and the second planarization layer 115*b*. The bank BB can be formed of an opaque material to reduce color mixture between the plurality of sub pixels SP and for example, can be formed of black resin, but is not limited thereto.

The protection layer 116 is disposed on the connection electrode and the bank BB. The protection layer 116 is a layer for protecting components below the protection layer 116, and can be configured by a single layer or a double layer of light transmitting epoxy, silicon oxide SiOx, or silicon nitride SiNx, but is not limited thereto.

In the meantime, when the display device 100 according to the exemplary embodiment of the present disclosure is manufactured, the adhesiveness of the adhesive layer AD is partially controlled to easily transfer the light emitting diode 120 from the donor. Hereinafter, a method of manufacturing a display device 100 according to an exemplary embodiment of the present disclosure will be described with reference to FIGS. 4A to 4I.

FIGS. 4A to 4I are process diagrams for explaining a method of manufacturing a display device according to an exemplary embodiment of the present disclosure. In FIGS. 4A to 4I, for the convenience of description, a process of transferring the light emitting diode 120 onto the plurality of first sub pixels SP1 is illustrated. The process of transferring the light emitting diode 120 onto the second sub pixel SP2 and the third sub pixel SP3 is substantially the same as a process of transferring the light emitting diode 120 onto the first sub pixel SP1. For the convenience of description, a cured portion of the adhesive layer AD is not illustrated with hatching, but a portion which is not cured is illustrated with hatching.

Figure 4A:
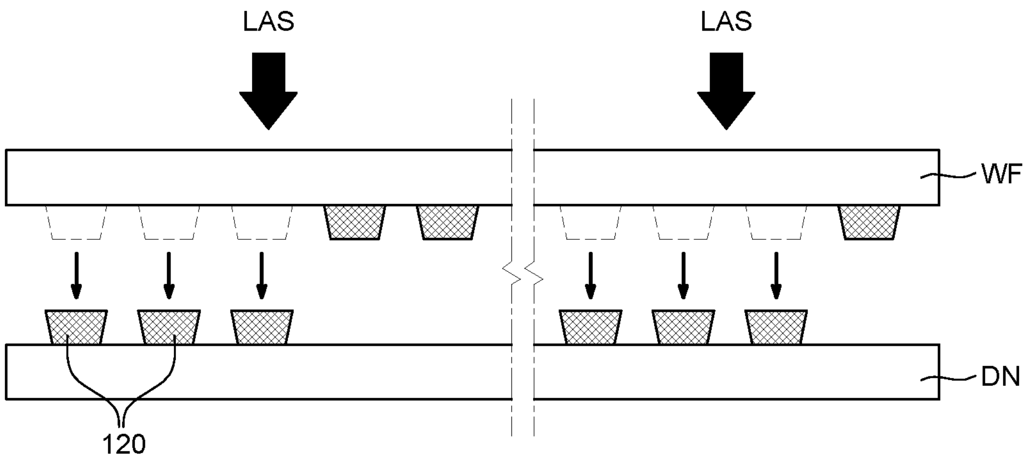
FIGS. 4A to 4I are process diagrams for explaining a method of manufacturing a display device according to an exemplary embodiment of the present disclosure.

Referring to FIG. 4A, a wafer WF on which the plurality of light emitting diodes 120 is formed is disposed on a donor DN.

The wafer WF is a substrate on which the plurality of light emitting diodes 120 is formed. After growing a crystal layer by forming a material which configures the plurality of light emitting diodes 120, such as gallium nitride GaN or indium gallium nitride InGaN, on the wafer WF 200, the crystal layer is cut into individual chips and an electrode is formed to form the plurality of light emitting diodes 120. The wafer WF can be formed of sapphire, silicon carbide (SiC), gallium nitride (GaN), or zinc oxide (ZnO), but is not limited thereto.

The donor DN is a transferring member which transfers the plurality of light emitting diodes 120 onto the wafer WF into the display panel PN. The plurality of light emitting diodes 120 is transferred onto the donor DN with a constant interval to transfer the plurality of light emitting diodes 120 onto the display panel PN at one time. The donor DN can include a polymer resin having viscoelasticity to allow the plurality of light emitting devices 120 to be attached thereto.

After disposing the plurality of light emitting diodes 120 on the wafer WF to face the donor DN, some of the plurality of light emitting diodes 120 of the wafer WF can be selectively transferred onto the donor DN. For example, laser LAS can be irradiated toward some of the light emitting diodes 120 among the plurality of light emitting diodes 120 on the wafer WF and the light emitting diode 120 can be detached from the wafer WF by the laser LAS to be attached onto the donor DN.

Figure 4B:
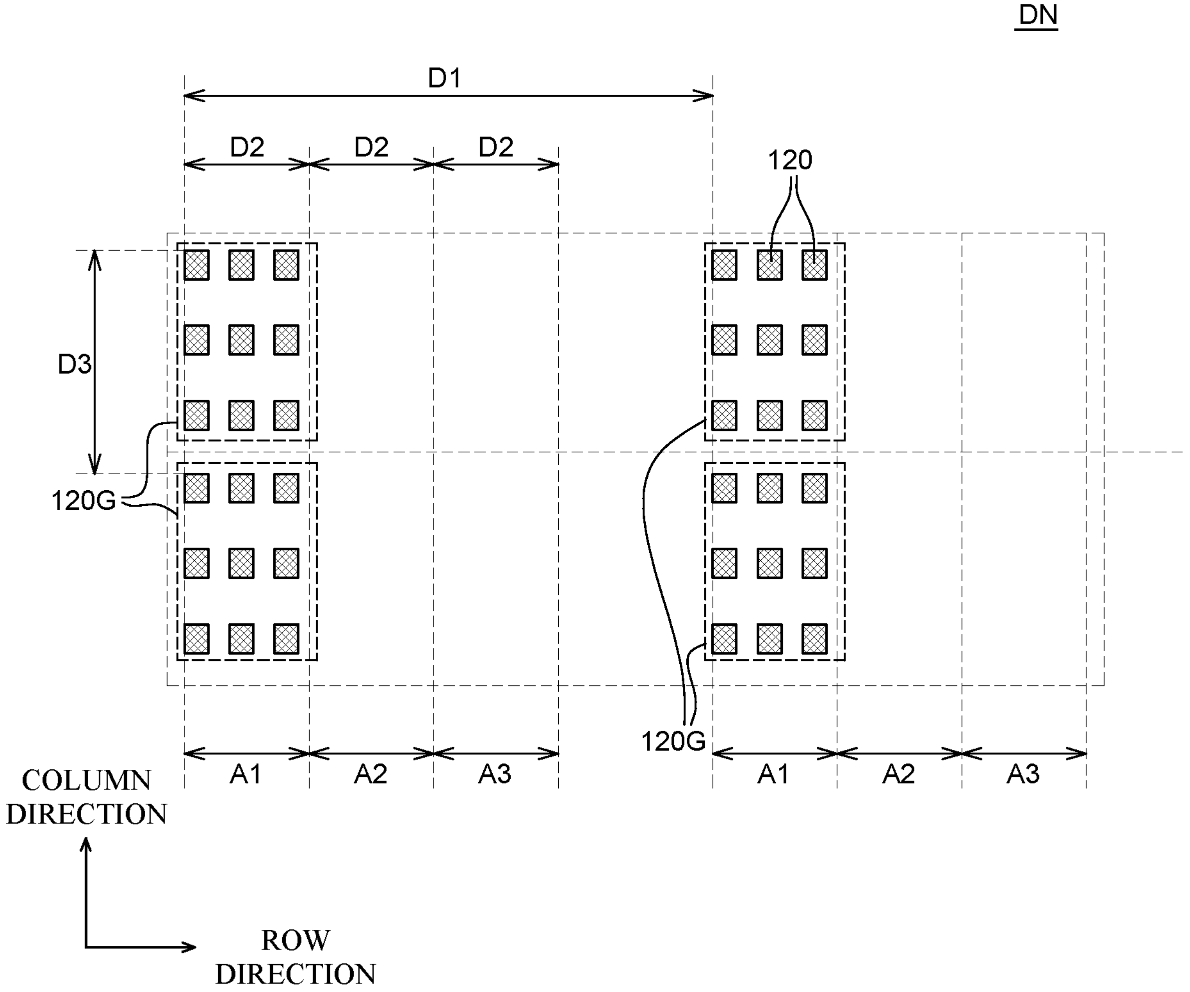

Referring to FIG. 4B together, the plurality of light emitting diodes 120 which is transferred onto the donor DN can be disposed in a plurality of first area A1 of the donor DN. The plurality of first areas A1 is an area corresponding to a column in which the plurality of first sub pixels SP1 is disposed and the plurality of light emitting diodes 120 disposed in the plurality of first areas A1 can be transferred onto the first sub pixel SP1. Each of the plurality of first areas A1 can be disposed with an interval of the first distance D1 which is the same as the interval of the plurality of pixels PX. An interval from one edge of one first area A1 to one edge of an adjacent first area A1 can be the first distance D1.

The donor DN includes a plurality of second areas A2 and a plurality of third areas A3 together with the plurality of first areas A1. The plurality of second areas A2 is areas corresponding to a column in which the plurality of second sub pixels SP2 is disposed and the plurality of third areas A3 is areas corresponding to a column in which the plurality of third sub pixels SP3 is disposed. Accordingly, when the light emitting diodes 120 are transferred onto the plurality of second sub pixels SP2, the plurality of light emitting diodes 120 can be disposed in the plurality of second areas A2 of the donor DN. Similarly, when the light emitting diodes 120 are transferred onto the plurality of third sub pixels SP3, the plurality of light emitting diodes 120 can be disposed in the plurality of third areas A3 of the donor DN.

In the meantime, the plurality of light emitting diodes 120 which is transferred onto the plurality of first areas A1 of the donor DN can be transferred to form a plurality of groups 120G. Each of the plurality of groups 120G includes a plurality of light emitting diodes 120. When the donor DN is bonded to the display panel PN, each of the plurality of groups 120G can correspond to one sub pixel SP and an area adjacent to one sub pixel SP. For example, when the group 120G is disposed in the first sub pixel SP1 and an area adjacent thereto, one group 120G can overlap an area between one edge of the first sub pixel SP1 and one edge of the second sub pixel SP2 in the row direction and an area between one edge of the first sub pixel SP1 and one edge of an adjacent sub pixel SP1 in the column direction.

The plurality of light emitting diodes 120 which forms one group 120G can be disposed while forming an interval smaller than an interval between the sub pixels SP in the row direction and the column direction, respectively. For example, the plurality of light emitting diodes 120 which forms one group 120G can be disposed to have an interval smaller than the second distance D2 in the row direction and an interval smaller than the third distance D3 in the column direction.

The number of light emitting diodes 120 included in each group 120G can vary depending on the number of times of continuously using one donor DN in the transfer process. For example, when one donor DN is continuously used n times for the transfer process of transferring the light emitting diode 120 onto the display panel PN, n light emitting diodes 120 can be disposed in one group 120G. The plurality of light emitting diodes 120 included in one group 120G in each of the plurality of number of times of transfer processes can be transferred onto the sub pixels SP in different positions, respectively. Only an adhesive layer AD in an area to which the plurality of light emitting diodes 120 is transferred selectively has an adhesiveness so that only one of the plurality of light emitting diodes 120 included in one group 120G can be selectively transferred onto the sub pixel SP. Accordingly, the transfer process can be continuously performed multiple times with one donor DN. A more detailed description thereof will be described in more detail with reference to FIGS. 5A to 5E.

Figure 4C:
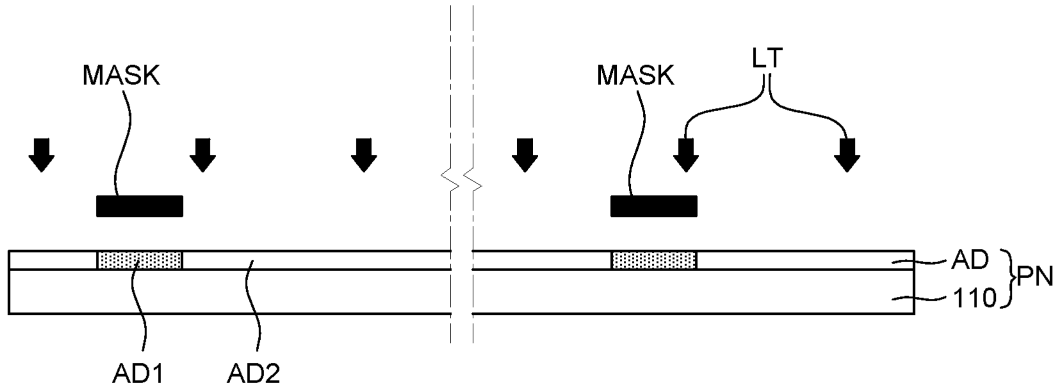
Figure 4D:
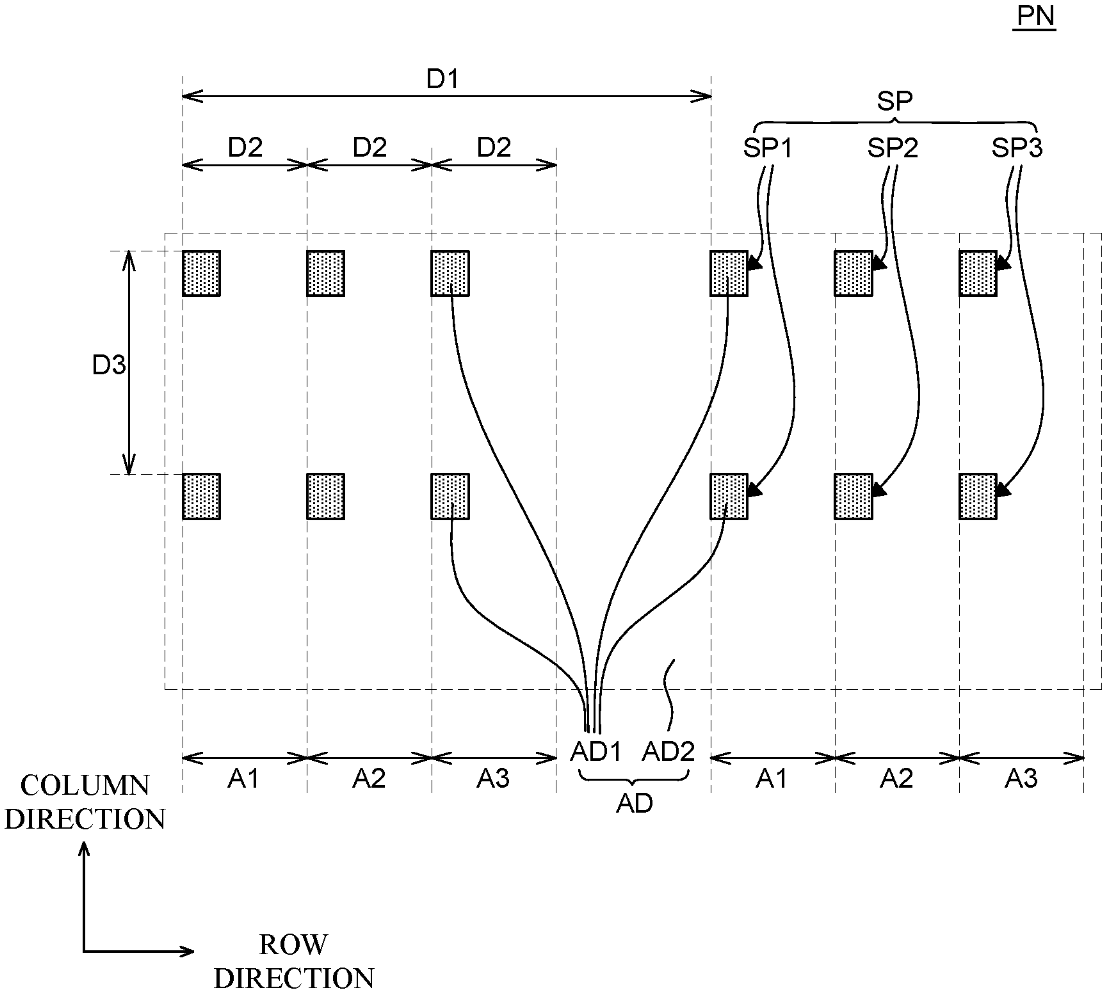
Figure 4E:
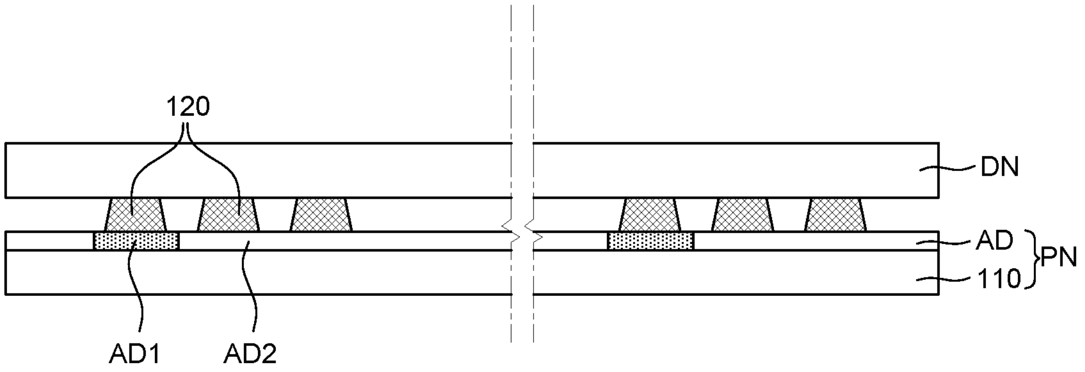

Next, referring to FIGS. 4C and 4D, a mask MASK is disposed on the display panel PN which is formed to the adhesive layer AD and light LT is irradiated thereonto. A mask MASK which blocks an area onto which the plurality of light emitting diodes 120 is transferred is disposed to irradiate light LT only onto the remaining area onto which the plurality of light emitting diodes 120 is not transferred. Accordingly, the adhesive layer AD can be configured by a plurality of first parts AD1 onto which the light LT is not irradiated and a second part AD2 onto which light LT is irradiated.

The plurality of first parts AD1 corresponds to the plurality of sub pixels SP, respectively, and the second part AD2 corresponds to an area between the sub pixels SP. The second part AD2 of the adhesive layer AD onto which the light LT is irradiated is hardened so that it does not have adhesiveness and the plurality of first parts AD1 of the adhesive layer AD onto which the light LT is not irradiates can have adhesiveness. Accordingly, in the adhesive layer AD formed on the front surface of the display panel PN, only the adhesive layer AD of the plurality of first parts AD1 corresponding to the plurality of sub pixels SP has adhesiveness, but the adhesive layer AD of the remaining second area A2 does not have adhesiveness.

Figure 4F:
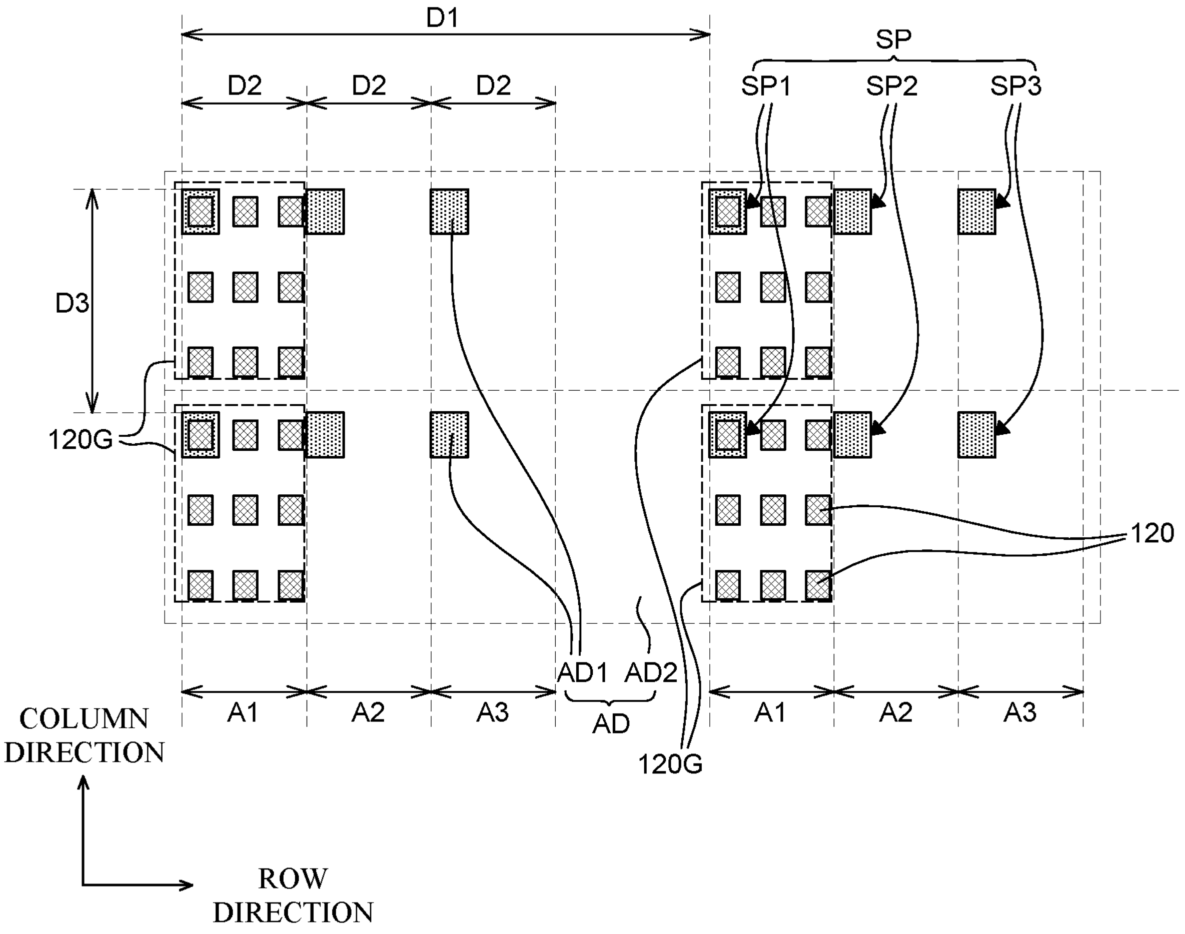

Next, referring to FIGS. 4E to 4H, the plurality of light emitting diodes 120 on the donor DN is transferred onto the adhesive layer AD of the display panel PN. Specifically, referring to FIGS. 4E and 4F, the display panel PN on which the adhesive layer AD is formed and the donor DN are aligned. After disposing the donor DN such that the plurality of light emitting diodes 120 of the donor DN faces the adhesive layer AD of the display panel PN with each other, the display panel PN and the donor DN can be bonded. When the donor DN and the display panel PN are bonded, the adhesive layer AD of the display panel PN and the plurality of light emitting diodes 120 of the donor DN can overlap as illustrated in FIG. 4F.

Figure 4G:
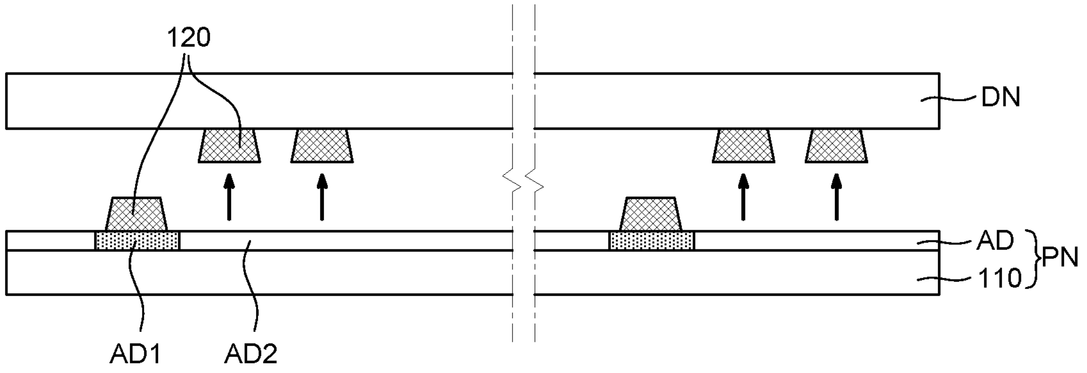
Figure 4H:
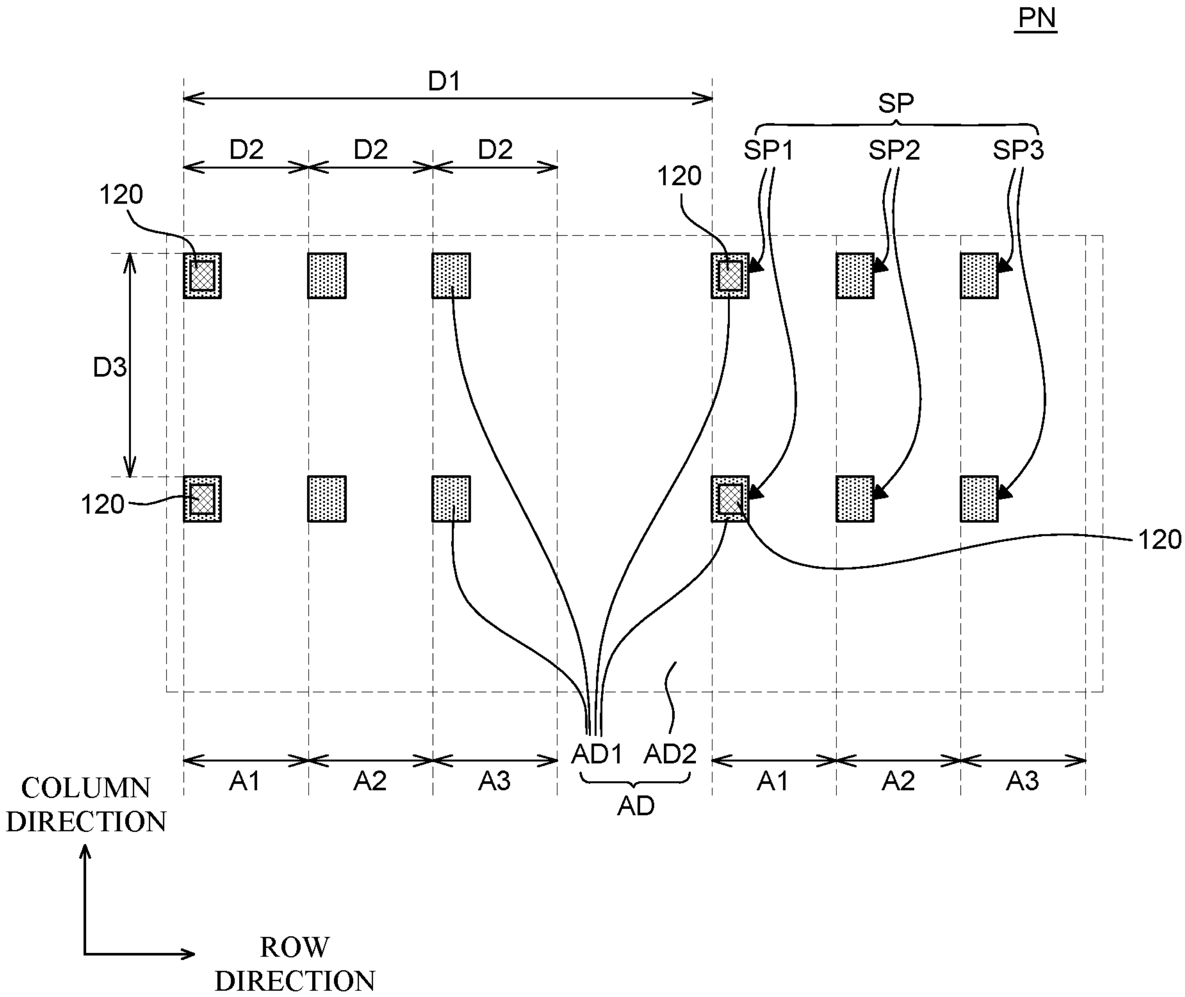

Referring to FIGS. 4G and 4H together, after bonding the donor DN and the display panel PN to transfer the light emitting diode 120 on the donor DN onto the adhesive layer AD, the donor DN can be detached from the display panel PN.

The light emitting diodes 120 attached onto the plurality of first parts AD1 of the adhesive layer AD is detached from the donor DN to be transferred onto the display panel PN. However, the light emitting diode 120 which is in contact onto the second part AD2 of the adhesive layer AD which is hardened during the previous exposure process to remove the adhesiveness can maintain an attached state to the donor DN. Accordingly, only the light emitting diode 120 which is in contact with the plurality of first parts AD1 of the adhesive layer AD which is not irradiated with light LT to have adhesiveness can be detached from the donor DN.

At this time, since the plurality of light emitting diodes 120 is disposed on the donor DN so as to correspond to only the plurality of first areas A1, the plurality of light emitting diodes 120 of the donor DN can overlap only the plurality of first areas A1 in which the plurality of sub pixels SP1 of the display panel PN is disposed. Only one light emitting diode 120, among the plurality of light emitting diodes 120 included in one group 120G, is in contact with the first part AD1 of the first area A1 to be transferred onto the display panel PN and the remaining light emitting diodes 120 are in contact with the second part AD2 to remain on the donor DN as it is. Further, the light emitting diode 120 is not disposed in the part of the donor DN corresponding to the plurality of second areas A2 and the plurality of third areas A3 so that the light emitting diode 120 is not transferred onto the plurality of first parts AD1 in the plurality of second areas A2 and the plurality of third areas A3. Accordingly, the plurality of light emitting diodes 120 can be transferred onto all the plurality of first sub pixels SP1 disposed in the plurality of first areas A1. The plurality of light emitting diodes 120 remaining in each of the plurality of groups 120G of the donor DN can be transferred onto the display panel PN during another transfer process thereafter.

Next, a process of transferring the light emitting diode 120 onto the plurality of second sub pixels SP2 disposed in the plurality of second areas A2 and transferring the light emitting diode 120 onto the plurality of third sub pixels SP3 disposed in the plurality of third areas A3 is repeatedly performed. By doing this, the light emitting diode 120 can be transferred onto all the plurality of sub pixels SP. Specifically, as illustrated in FIGS. 4A and 4B, the plurality of light emitting diodes 120 on the wafer WF can be transferred onto the plurality of second areas A2 of the donor DN and as illustrated in FIGS. 4E to 4H, the light emitting diode 120 of the donor DN can be transferred onto the plurality of first parts AD1 in the plurality of second areas A2, for example, onto the adhesive layer AD of the second sub pixel SP2. The light emitting diode 120 can be also transferred onto the plurality of third sub pixels SP3 by repeating the processes in FIGS. 4A, 4B, 4E to 4H in the same way.

Figure 4I:
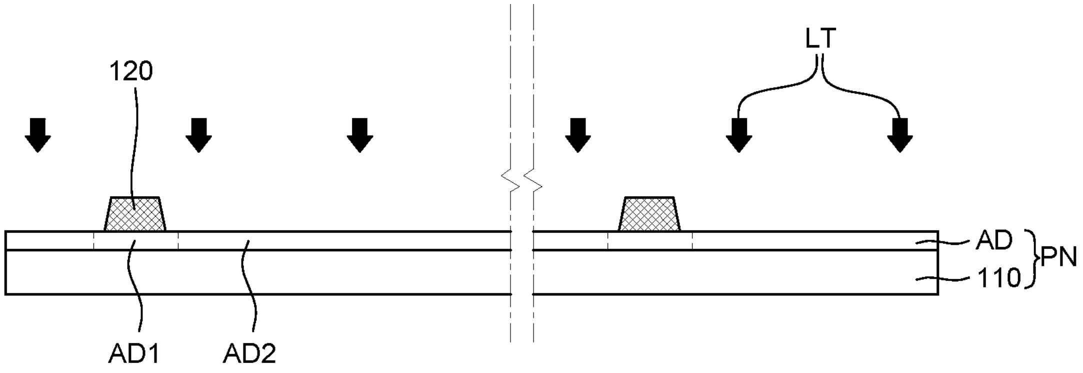

Finally, referring to FIG. 4I, after completing the transfer process of the light emitting diode 120 onto all the plurality of sub pixels SP, light LT is irradiated onto the entire adhesive layer AD to harden the entire adhesive layer AD. The light LT is irradiated onto the entire adhesive layer AD without a separate mask MASK to harden even the plurality of first parts AD1 of the adhesive layer AD.

However, after hardening the adhesive layer AD, the second planarization layer 115*b*, the third planarization layer 115*c*, the bank BB, the first connection electrode CE1, the second connection electrode CE2, and the protection layer 116 are formed on the adhesive layer AD. By doing this, the manufacturing process of the display device 100 can be completed.

Accordingly, in the display device 100 according to the exemplary embodiment of the present disclosure and the method of manufacturing the display device 100, the plurality of light emitting diodes 120 is disposed on the donor DN with a smaller interval than the interval between the plurality of sub pixels SP. However, the transfer process can be performed by allowing only the plurality of first parts AD1 corresponding to the plurality of sub pixels SP, of the adhesive layer AD of the display panel PN, to have the adhesiveness. Therefore, only the light emitting diode 120 which is aligned so as to overlap the plurality of sub pixels SP, among the plurality of light emitting diodes 120 on the donor DN, can be selectively transferred onto the display panel PN. Accordingly, the defect of transferring the light emitting diode 120 onto the display panel PN in an area other than the plurality of sub pixels SP can be minimized.

In the meantime, in the method of manufacturing the display device 100 according to the exemplary embodiment of the present disclosure, the transfer process is continuously performed plural times with one donor DN to shorten the process time. This will be described in more detail with reference to FIGS. 5A to 5E.

FIGS. 5A to 5E are process diagrams for explaining a method of manufacturing a display device according to an exemplary embodiment of the present disclosure. FIGS. 5A to 5E are views for explaining a process of transferring the plurality of light emitting diodes 120 on the donor DN onto the display panel PN when the display panel PN is larger than the donor DN.

Figure 5A:
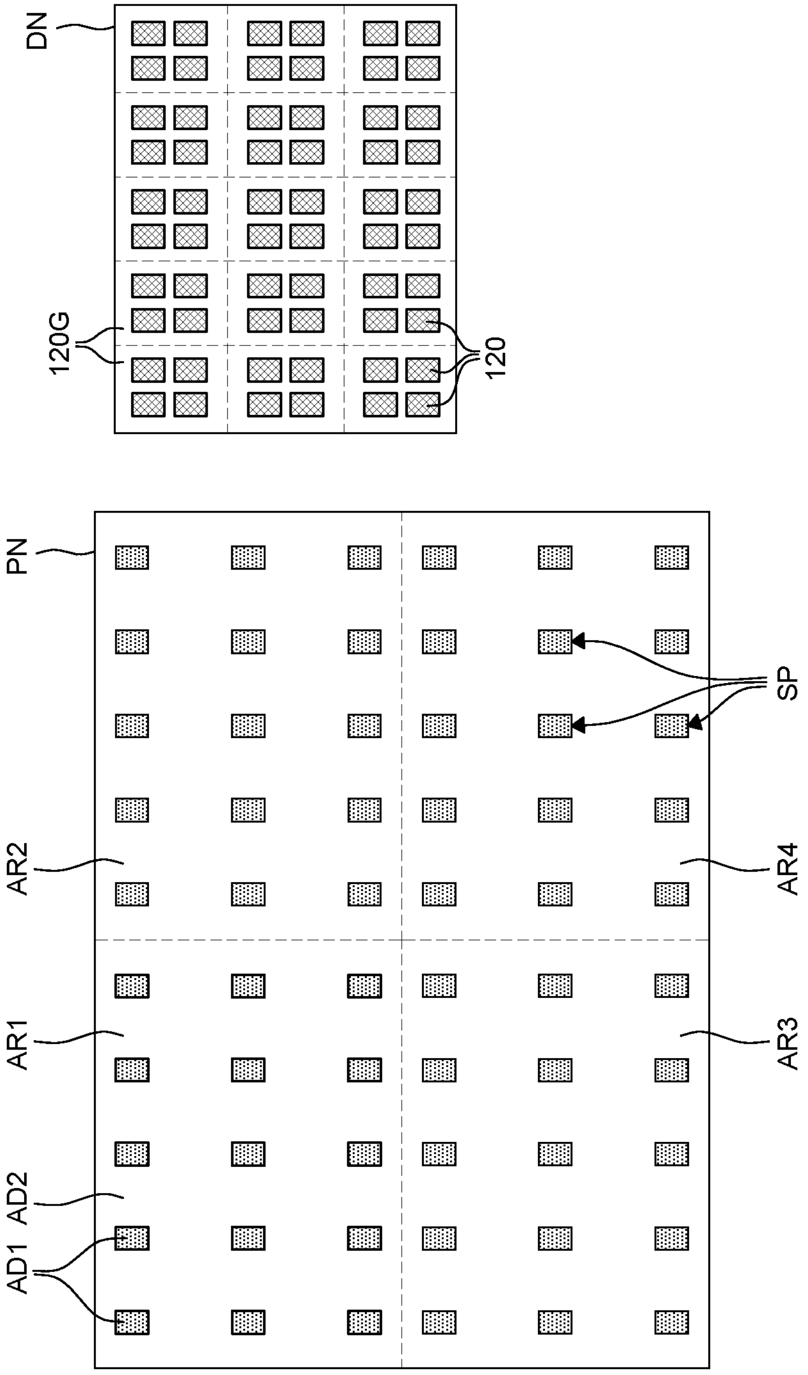
FIGS. 5A to 5E are process diagrams for explaining a method of manufacturing a display device according to an exemplary embodiment of the present disclosure.

Referring to FIG. 5A, the display panel PN can have a larger size than the donor DN. For example, the size of the display panel PN is approximately four times larger than the size of the donor DN so that in order to transfer the light emitting diode 120 onto the entire display panel PN, four donors or four times of transfer process can be necessary. However, in the method of manufacturing the display device 100 according to the exemplary embodiment of the present disclosure, only an area corresponding to the plurality of sub pixels SP has adhesiveness so that only some of the plurality of light emitting diodes 120 disposed on one donor DN can be selectively transferred onto the display panel PN. Further, the transfer process can be performed plural times with one donor DN.

Hereinafter, for the convenience of description, it is assumed that the size of the display panel PN is approximately four times the size of the donor DN, but a ratio of the sizes of the donor DN and the display panel PN is illustrative and is not limited thereto.

In this case, the display panel PN in which the light emitting diode 120 is transferred onto all the plurality of sub pixels SP by four transfer processes can be formed by four areas in which one transfer process is performed, for example, a first transfer area AR1, a second transfer area AR2, a third transfer area AR3, and a fourth transfer area AR4. The light emitting diode 120 can be transferred onto any one of the first transfer area AR1, the second transfer area AR2, the third transfer area AR3, and the fourth transfer area AR4, by one transfer process.

Before transferring the light emitting diode 120 onto the display panel PN from the donor DN, the mask MASK is disposed on the adhesive layer AD formed in the entire display panel PN and the light LT is irradiated thereto to form the adhesive layer AD to have the plurality of first parts AD1 and the second part AD2. The plurality of first parts AD1 corresponds to the plurality of sub pixels SP and has the adhesiveness and the second part AD2 is irradiated with the light LT so that it does not have adhesiveness. Accordingly, the adhesive layer AD is formed on the entire display panel PN, but only an area corresponding to the plurality of sub pixels SP can be formed to have partially adhesiveness.

Further, all the plurality of light emitting diodes 120 to be transferred onto the first transfer area AR1, the second transfer area AR2, the third transfer area AR3, and the fourth transfer area AR4 can be disposed on the donor DN. For example, when fifteen sub pixels SP and fifteen light emitting diodes 120 are disposed in each of the first transfer area AR1, the second transfer area AR2, the third transfer area AR3, and the fourth transfer area AR4, fifteen groups 120G including four light emitting diodes 120 used for four transfer processes, for example, 60 light emitting diodes 120 can be disposed in the donor DN.

Figure 5B:
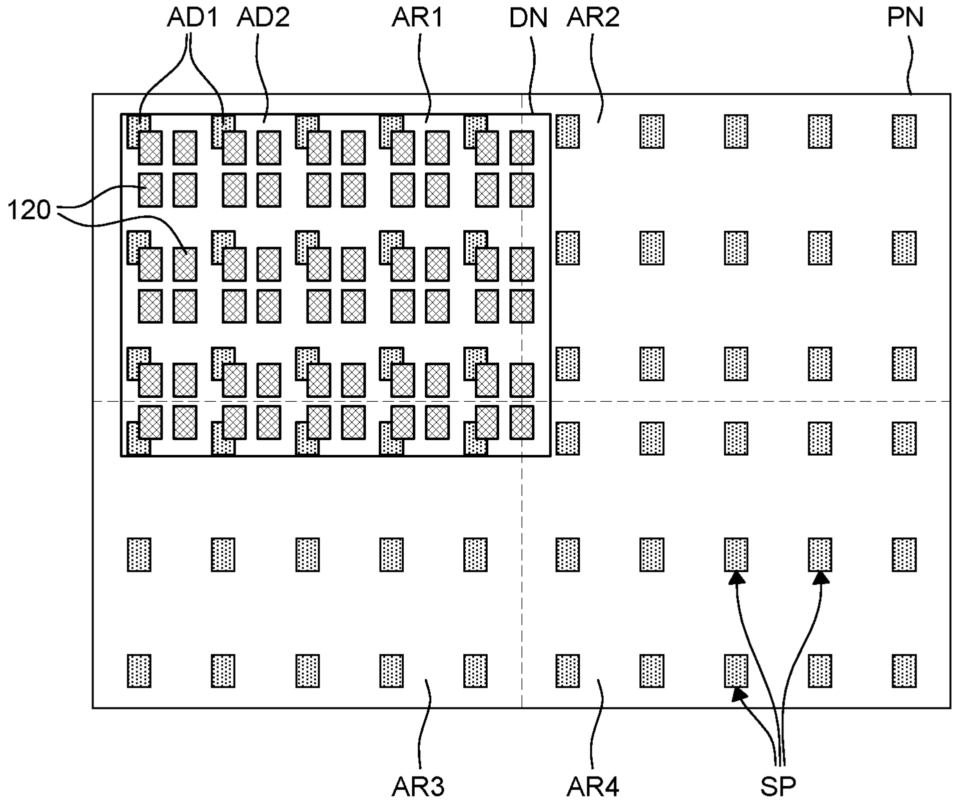

Referring to FIG. 5B, the donor DN is bonded onto the first transfer area AR1 of the display panel PN to transfer the plurality of light emitting diodes 120 on the donor DN onto the display panel PN. At this time, even though all the plurality of light emitting diodes 120 on the donor DN is in contact onto the adhesive layer AD of the first transfer area AR1, only the light emitting diode 120 having adhesiveness which is in contact with the plurality of first parts AD1 is selectively transferred onto the first transfer area AR1. However, the light emitting diode 120 which is in contact with the second part AD2 can remain in the donor DN as it is.

Figure 5C:
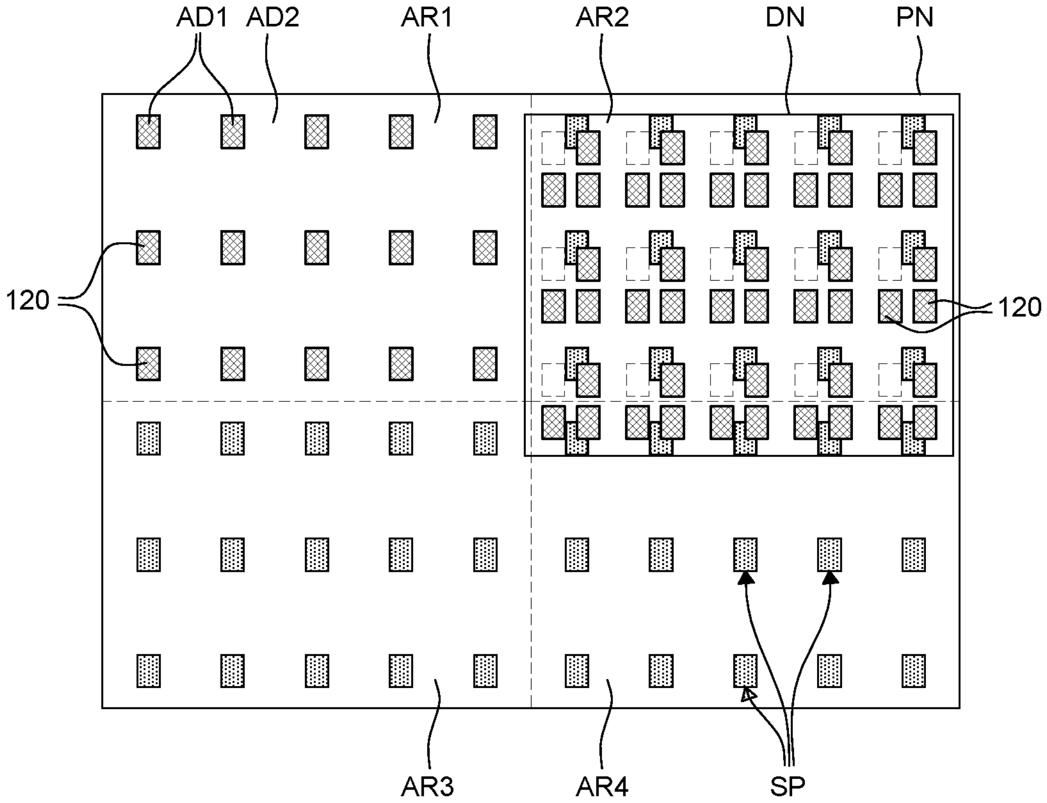

Next, referring to FIG. 5C, the donor DN is bonded onto the second transfer area AR2 by shifting the donor DN so as to bring any one of the plurality of light emitting diodes 120 of each of the plurality of groups 120G on the donor DN to be in contact with the plurality of first parts AD1 of the adhesive layer AD. The donor DN and the display panel PN are aligned to overlap any one of the plurality of light emitting diodes 120 of each group 120G and the first part AD1 of the adhesive layer AD to bond the donor DN onto the display panel PN. Accordingly, the plurality of light emitting diodes 120 of the donor DN is in contact with the plurality of first parts AD1 so that the light emitting diode 120 can be transferred onto the plurality of sub pixels SP of the second transfer area AR2. The remaining light emitting diode 120 which is in contact with the second part AD2 of the second transfer area AR2 can maintained in a state attached to the donor DN.

Figure 5D:
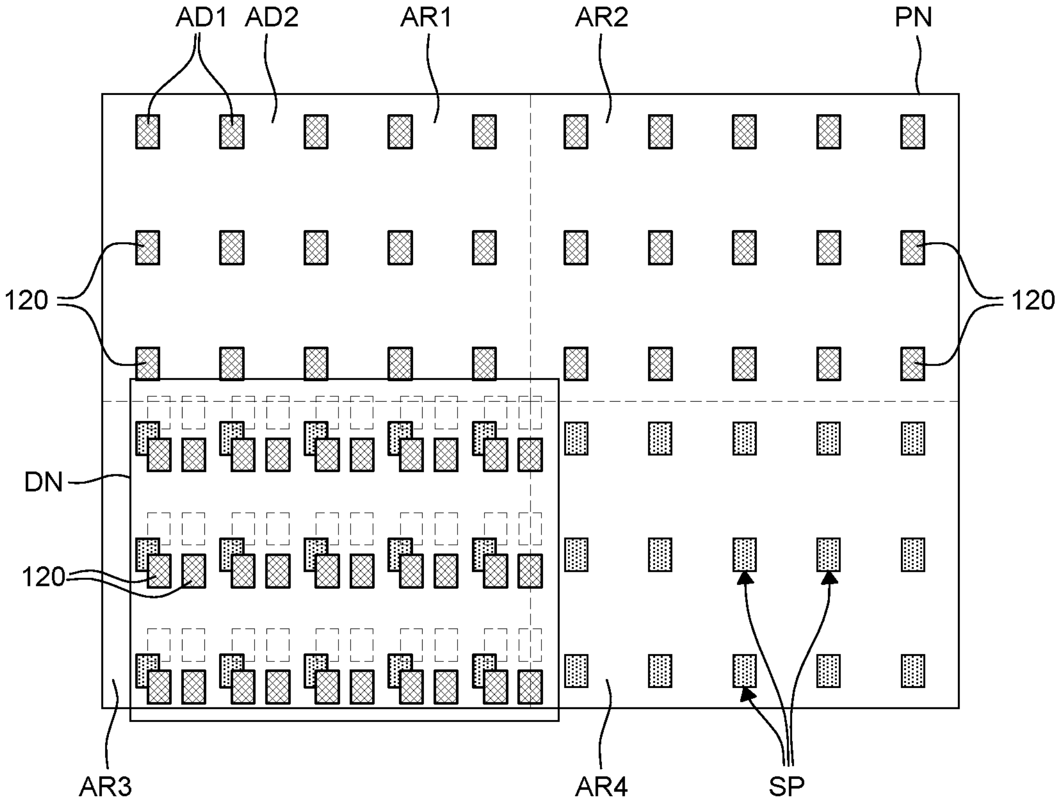

Referring to FIG. 5D, similar to the transfer process in the second transfer area AR2, the donor DN is shifted to be bonded onto the third transfer area AR3. Specifically, after aligning the donor DN such that any one of the plurality of light emitting diodes 120 of each group 120G corresponds to the first part AD1 of the adhesive layer AD, the donor DN can be bonded onto the third transfer area AR3. Therefore, any one of the light emitting diodes 120 of each group 120G can be transferred onto the plurality of sub pixels SP of the third transfer area AR3.

Figure 5E:
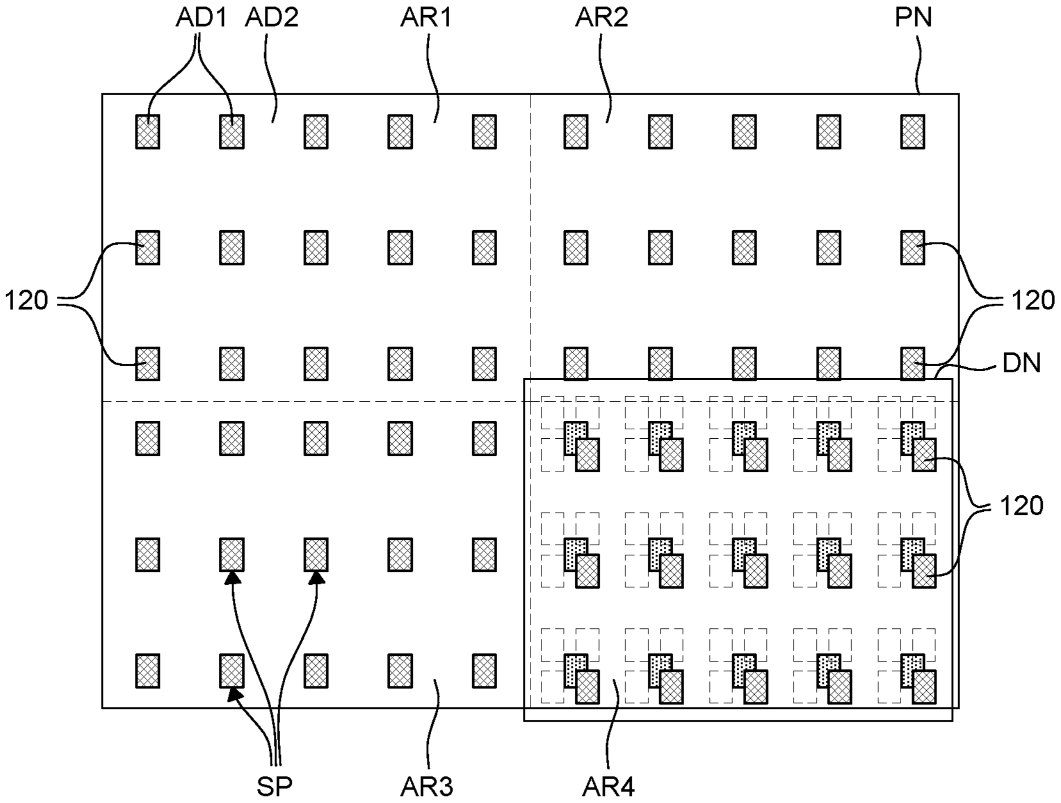

Finally, referring to FIG. 5E, the donor DN is aligned such that the light emitting diode 120 remaining in each of the plurality of groups 120G on the donor DN corresponds to the first part AD1 of the adhesive layer AD to be bonded onto the fourth transfer area AR4. Accordingly, all the plurality of light emitting diodes 120 disposed on the donor DN can be transferred onto the display panel PN.

For example, in order to transfer the light emitting diode on the donor onto the plurality of sub pixels in a state in which the entire adhesive layer has adhesiveness, the light emitting diodes needs to be disposed on the donor so as to correspond to the plurality of sub pixels. If the light emitting diode is located on an area which does not correspond to the plurality of sub pixels, during the bonding process of the donor and the display panel, the defect in which the light emitting diode is also transferred onto an area other than the sub pixel can occur. Therefore, when the display panel has a larger size than the donor, the display device can be manufactured using a plurality of donors in which the light emitting diode is disposed with an arrangement corresponding to each of the plurality of sub pixels. However, since the plurality of donors is used, the number of times of process of selectively transferring the light emitting diode on the wafer onto the donor can be increased and the process time can be increased.

In contrast, according to the display device 100 according to the exemplary embodiment of the present disclosure and the method of manufacturing the display device 100, the plurality of light emitting diodes 120 is transferred onto the donor DN at one time. Further, only an area of the adhesive layer AD of the display panel PN corresponding to the plurality of sub pixels SP selectively has adhesiveness. Accordingly, only some of the plurality of light emitting diodes 120 on the donor DN can be selectively transferred onto the sub pixel SP. Therefore, the light emitting diode 120 can be transferred in a plurality of areas of the display panel PN with one donor DN so that the number of donors DN required for the entire transfer process can be reduced. Accordingly, the number of times of process of transferring the light emitting diode 120 onto the donor DN from the wafer WF and the process time can be reduced.

Figure 6:
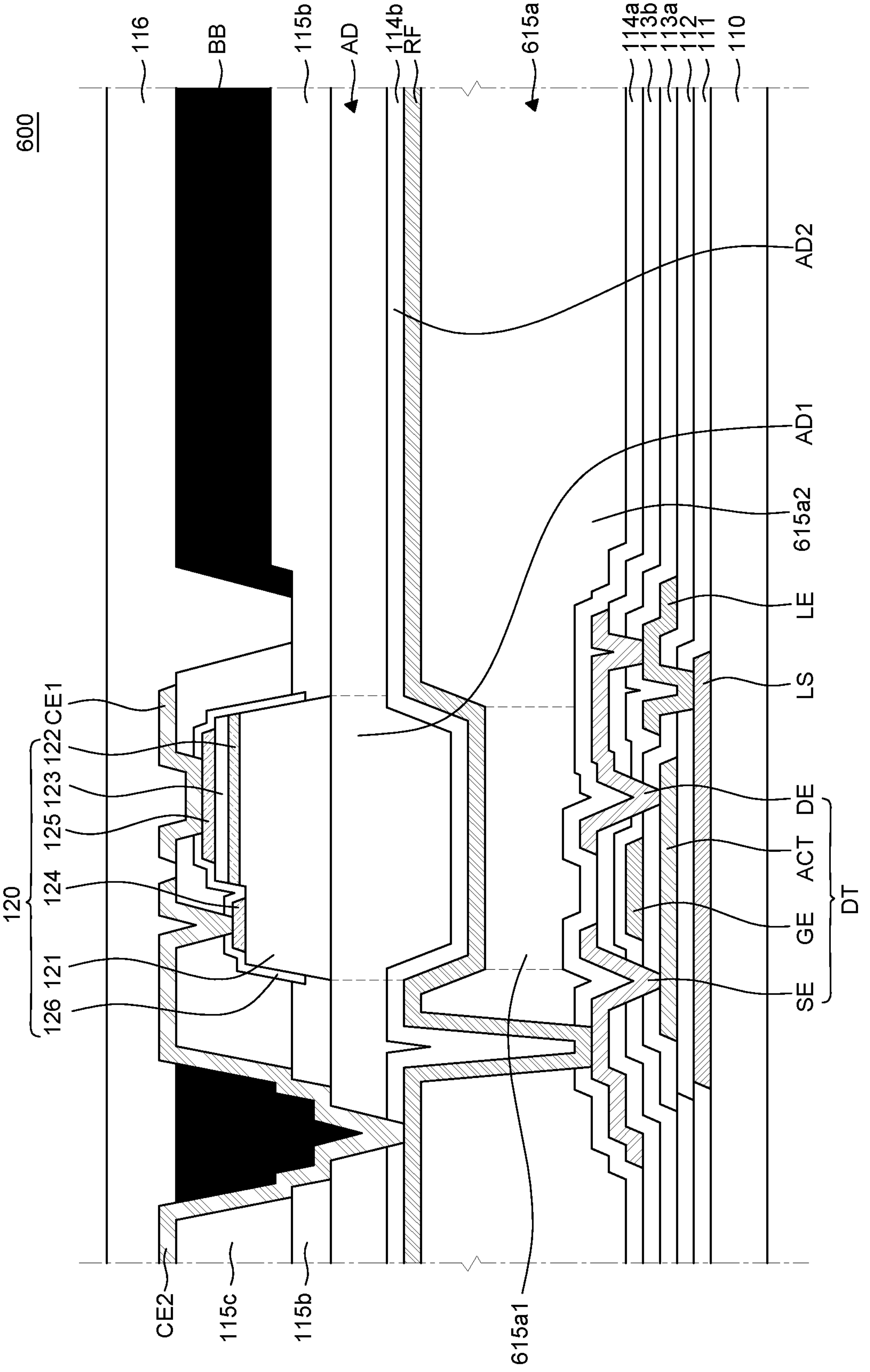
FIG. 6 is a cross-sectional view of a display device according to another exemplary embodiment of the present disclosure.
Figure 7:
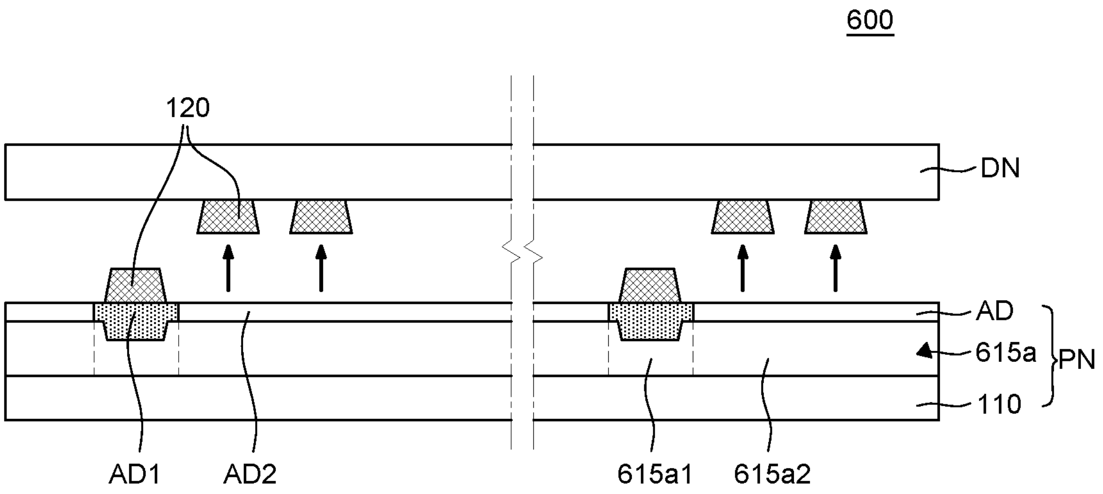
FIG. 7 is a process diagram for explaining a method of manufacturing a display device according to another exemplary embodiment of the present disclosure.
Figure 8:
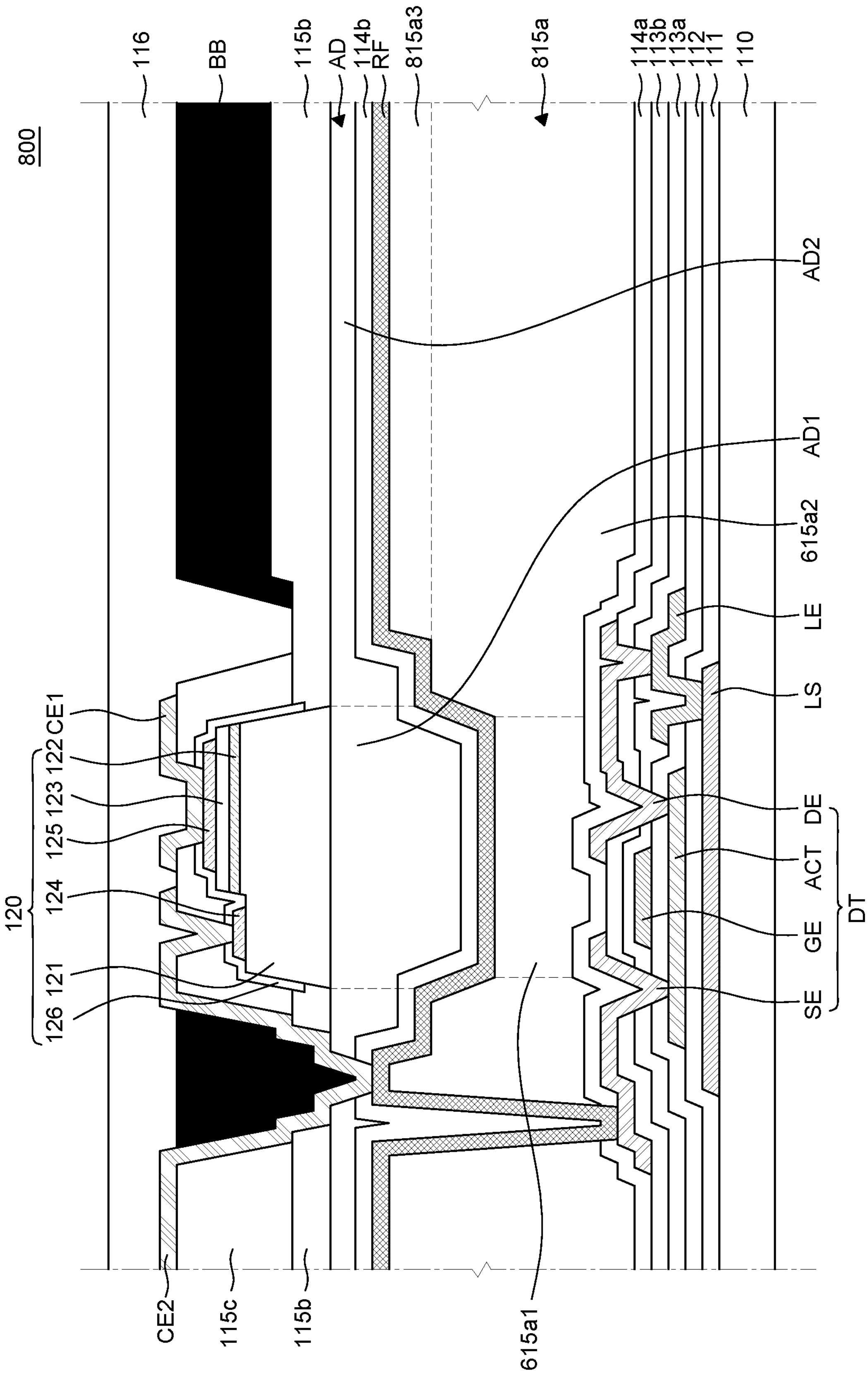
FIG. 8 is a cross-sectional view of a display device according to still another exemplary embodiment of the present disclosure.
Figure 9:
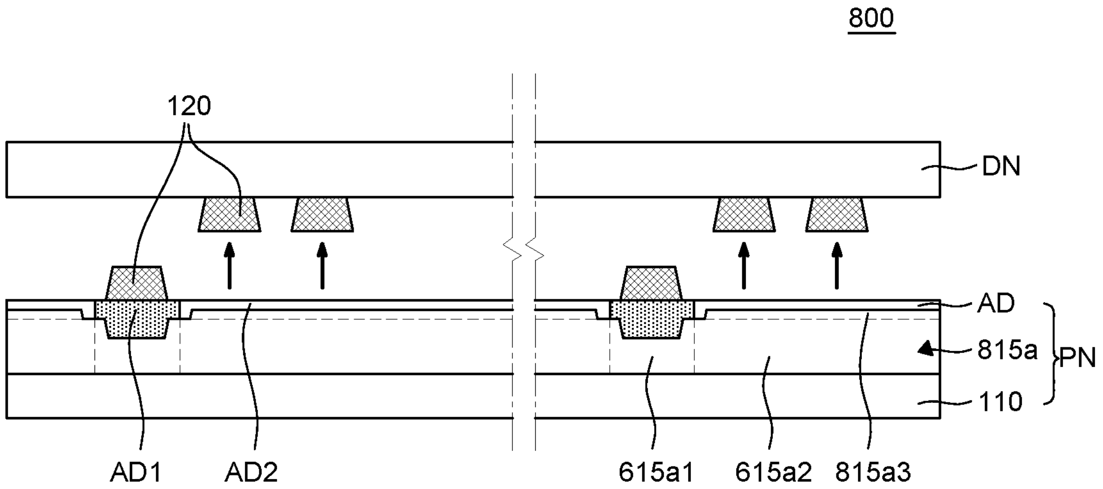
FIG. 9 is a process diagram for explaining a method of manufacturing a display device according to still another exemplary embodiment of the present disclosure.

FIG. 6 is a cross-sectional view of a display device according to another exemplary embodiment of the present disclosure. FIG. 7 is a process diagram for explaining a method of manufacturing a display device according to another exemplary embodiment of the present disclosure. FIG. 8 is a cross-sectional view of a display device according to still another exemplary embodiment of the present disclosure. FIG. 9 is a process diagram for explaining a method of manufacturing a display device according to still another exemplary embodiment of the present disclosure. As compared with the display device 100 of FIGS. 1 to 5E, in a display device 600 of FIG. 6 and a display device 800 of FIG. 8, only first planarization layers 615*a* and 815*a* and an adhesive layer AD are different and the other configurations are the same or substantially the same so that a redundant description will be omitted or is provided briefly. For the convenience of description, in FIGS. 7 and 9, among components of the display panel PN, only the substrate 110, the first planarization layers 615*a* and 815*a*, and the adhesive layer AD are illustrated.

Referring to FIG. 6, the first planarization layer 615*a* of the display device 600 according to another exemplary embodiment of the present disclosure includes a concave portion 615*al* overlapping the light emitting diode 120 and a convex portion 615*a*2 which does not overlap the light emitting diode 120. An upper surface of the concave portion 615*al* of the first planarization layer 615*a* disposed below the light emitting diode 120 can be disposed to be lower than an upper surface of the convex portion 615*a*2.

The reflection layer RF and the second passivation layer 114*b* formed on the first planarization layer 615*a* can be formed to have a concave shape below the light emitting diode 120 along an upper surface shape of the first planarization layer 615*a*.

The adhesive layer AD formed on the second passivation layer 114*b* can be configured by a first part AD1 having a relatively large thickness and a second part AD2 having a relatively small thickness. Specifically, the plurality of first parts AD1 of the adhesive layer AD which is in contact with the plurality of light emitting diodes 120 can be disposed on the concave portion 615*al* of the first planarization layer 615*a*. The second part AD2 of the adhesive layer AD which is not in contact with the plurality of light emitting diodes 120 can be disposed on the convex portion 615*a*2 of the first planarization layer 615*a*. Accordingly, the plurality of first parts AD1 of the adhesive layer AD which is formed to fill a space on the concave portion 615*al* can be formed to be thicker than the second part AD2 of the adhesive layer AD disposed on the convex portion 615*a*2.

Referring to FIG. 7, after disposing a mask MASK which blocks the plurality of first parts AD1 of the adhesive layer AD, light LT is irradiated onto the remaining second part AD2 excluding the plurality of first parts AD1 to remove the adhesiveness of the second part AD2. Thereafter, when the donor DN is bonded onto the display panel PN, the light emitting diode 120 is attached only onto the plurality of first parts AD1 of the adhesive layer AD and the light emitting diode 120 which is in contact with the second part AD2 can maintain a state attached to the donor DN.

At this time, a thickness of the plurality of first parts AD1 of the adhesive layer AD to which the plurality of light emitting diodes 120 is attached is formed to be larger than that of the second part AD2 of the adhesive layer AD to improve the adhesiveness of the plurality of first parts AD1. The adhesiveness of the adhesive layer AD can be affected by a factor such as a thickness of the adhesive layer AD and a detachment speed of the donor DN and the display panel PN. For example, the larger the thickness of the adhesive layer AD, the larger the adhesiveness of the adhesive layer AD. Accordingly, the plurality of first parts AD1 of the adhesive layer AD which is in contact with the plurality of light emitting diodes 120 is formed to be thicker than the other part of the adhesive layer AD to more stably fix the plurality of light emitting diodes 120 onto the display panel PN.

Next, referring to FIG. 8, the first planarization layer 815*a* of the display device 800 according to still another exemplary embodiment of the present disclosure includes a concave portion 615*al* overlapping the light emitting diode 120, a convex portion 615*a*2 which does not overlap the light emitting diode 120, and an additional convex portion 815*a*3 protruding from the upper surface of the convex portion 615*a*2.

The upper surface of the concave portion 615*al* of the first planarization layer 815*a* disposed below the light emitting diode 120 can be disposed to be lower than an upper surface of the convex portion 615*a*2. An upper surface of the convex portion 615*a*2 in which the additional convex portion 815*a*3 is not disposed can be disposed to be lower than an upper surface of the additional convex portion 815*a*3. The additional convex portion 815*a*3 can be disposed on the most of the upper surface of the convex portion 615*a*2. For example, the convex portion 615*a*2 can be disposed around the concave portion 615*al* and the additional convex portion 815*a*3 can be further disposed on the convex portion 615*a*2 in an area outside with a predetermined radius from the concave portion 615*a*1.

The plurality of first parts AD1 of the adhesive layer AD can have a relatively large thickness and the second part AD2 can have a relatively small thickness. Specifically, as the additional convex portion 815*a*3 is disposed in the most of the convex portion 615*a*2 so that the most of the second part AD2 can be formed with a very small thickness.

Referring to FIG. 9, after disposing a mask MASK which blocks the plurality of first parts AD1 of the adhesive layer AD, light LT is irradiated onto the remaining second part AD2 excluding the plurality of first parts AD1 to remove the adhesiveness of the second part AD2 and bond the donor DN onto the display panel PN. In this case, the light emitting diode 120 is attached only onto the plurality of first parts AD1 of the adhesive layer AD and the light emitting diode 120 which is in contact with the second part AD2 can maintain a state attached to the donor DN.

Specifically, the most of the additional convex portion 815*a*3 overlaps the second part AD2 to form the thickness of the second part AD2 small so that even though a part of the adhesiveness of the second part AD2 remains, the attaching of the light emitting diode 120 onto the second part AD2 can be minimized.

Accordingly, in the display device 600 according to another exemplary embodiment of the present disclosure and the display device 800 according to still another exemplary embodiment of the present disclosure, a thickness of the plurality of first parts AD1 of the adhesive layer AD in which the plurality of light emitting diodes 120 is disposed is formed to be relatively thick. By doing this, the adhesiveness of the first part AD1 which is in direct contact with the light emitting diode 120 can be improved. Accordingly, the adhesiveness of the plurality of first parts AD1 of the adhesive layer AD is improved so that the light emitting diode 120 which is attached onto the donor DN is more easily separated from the donor DN to be fixed onto the adhesive layer AD of the display panel PN. At this time, the thickness of the plurality of first parts AD1 of the adhesive layer AD can be adjusted using shapes of the first planarization layers 615*a* and 815*a*. For example, parts of the first planarization layers 615*a* and 815*a* corresponding to the plurality of first parts AD1 are formed as concave portions 615*al* and parts of the first planarization layers 615*a* and 815*a* corresponding to the second part AD2 are formed as a convex portion 615*a*2. By doing this, the thickness of the second part AD2 can be formed to be thin and the thickness of the plurality of first parts AD1 can be formed to be thick. Accordingly, the thickness of the adhesiveness layer AD is designed to vary according to the area so that the defect in which the light emitting diode 120 is not transferred from the donor DN onto the display panel PN can be minimized.

Figure 10:
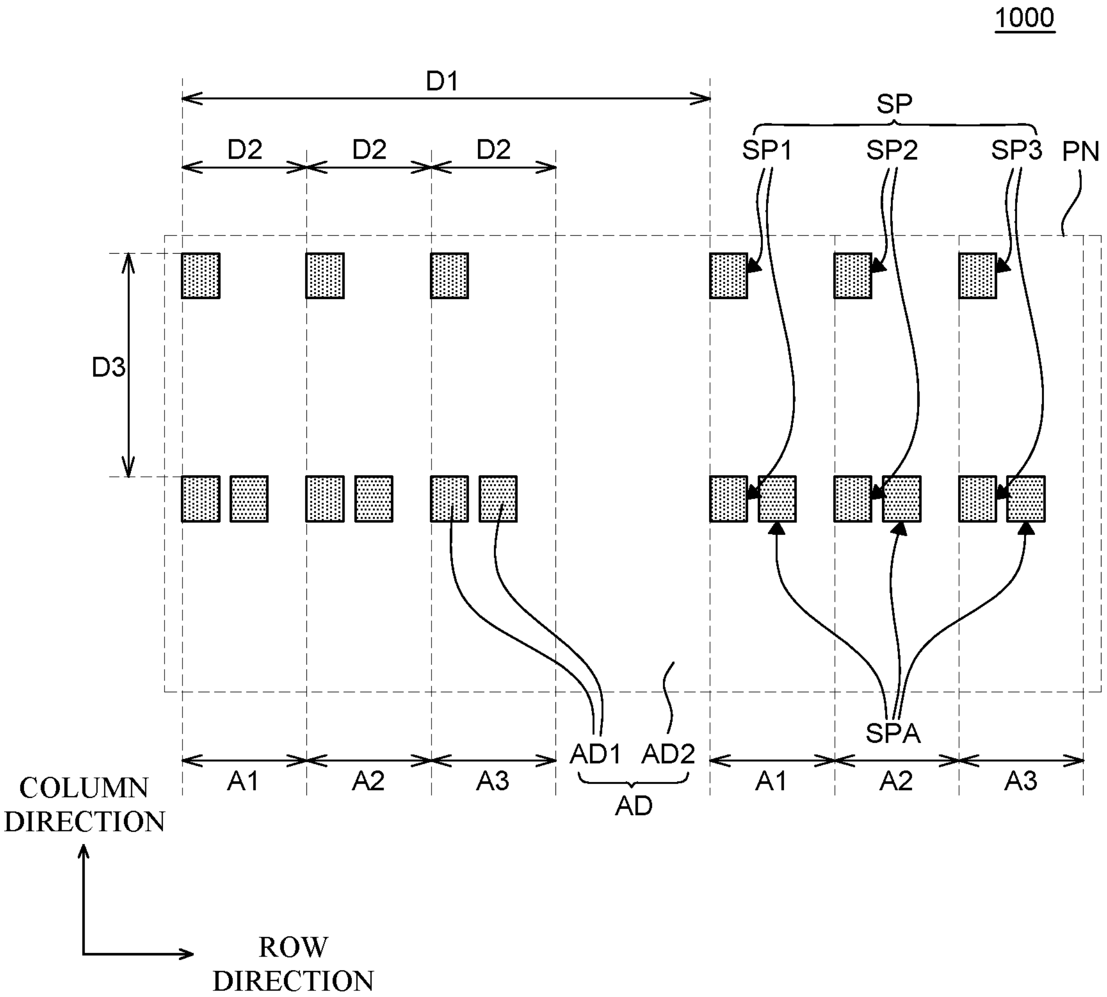
FIG. 10 is a plan view of a display device according to still another exemplary embodiment of the present disclosure.

FIG. 10 is a plan view of a display device according to still another exemplary embodiment of the present disclosure. A main difference between a display device 1000 of FIG. 10 and the display device 100 of FIGS. 1 to 5E is a plurality of sub pixels SP and an adhesive layer AD, but the other configurations are the same or substantially the same, so that a redundant description will be omitted or may be briefly provided. For the convenience of description, in FIG. 10, only the adhesive layer AD and the plurality of sub pixels SP are illustrated.

Referring to FIG. 10, an additional sub pixel SPA is further disposed on the substrate 110. The additional sub pixel SPA is a configuration for repairing a defective sub pixel SP by additionally transferring the light emitting diode 120 when the transfer defect of the light emitting diode 120 onto the sub pixel SP occurs. The additional sub pixel SPA can be disposed to be adjacent to some sub pixel SP among the plurality of sub pixels SP. For example, the additional sub pixel SPA can be disposed between the plurality of sub pixels SP in some row of the plurality of rows. However, the arrangement of the additional sub pixel SPA illustrated in FIG. 10 is just illustrative, and is not limited thereto.

After transferring the light emitting diode 120 onto the plurality of sub pixels SP by bonding the donor DN and the display panel PN, it can be inspected whether there is a sub pixel SP in which the transfer defect occurs. If the light emitting diode 120 is not transferred onto the first sub pixel SP1 among the plurality of sub pixels SP or is transferred out of the correct position, the light emitting diode 120 is transferred onto an additional sub pixel SPA adjacent to the first sub pixel SP1 to replace the defect sub pixel SP.

In order to transfer the light emitting diode 120 onto the additional sub pixel SPA, a part of the adhesive layer AD corresponding to the additional sub pixel SPA can be also formed as a first part AD1. For example, before transferring the plurality of light emitting diodes 120 onto the display panel PN, the mask MASK which blocks the plurality of sub pixels SP and the additional sub pixel SPA areas is disposed and the light LT is irradiated to remove the adhesiveness of the second part AD2 of the adhesive layer AD. The plurality of first parts AD1 onto which the light LT is not irradiated, for example, a part of the adhesive layer AD overlapping the plurality of sub pixels SP and the plurality of additional sub pixels SPA can have adhesiveness as it is. Accordingly, after detecting the transferring defect of the display panel PN, the light emitting diode 120 is transferred onto the first part AD1 of the additional sub pixel SPA to repair the defective sub pixel SP. Thereafter, when the repair is completed, the light LT is entirely irradiated again onto the plurality of first parts AD1 and the second part AD2 to harden the adhesive layer AD.

Accordingly, in the display device 1000 according to still another exemplary embodiment of the present disclosure, when an additional sub pixel SPA for repair is formed, the adhesive layer AD corresponding to the additional sub pixel SPA is also formed as the first part AD1 to transfer the light emitting diode 120 onto the display panel PN in the additional transfer process. Therefore, the adhesive layer AD can be designed with various structures in consideration of the repair process, and the like.

The display device and the manufacturing method according to various exemplary embodiments of the present disclosure will be described as follows:

A display device according to an exemplary embodiment of the present disclosure includes: a substrate in which each pixel including a plurality of sub pixels is defined; an adhesive layer disposed on the substrate; and a plurality of light emitting diodes disposed on the adhesive layer in each of the plurality of sub pixels, the adhesive layer can be configured by a plurality of first parts overlapping the plurality of light emitting diodes and a second part which is a remaining part excluding the plurality of first parts.

According to another feature of the present disclosure, an upper surface of the adhesive layer is flat and a thickness of the plurality of first parts is larger than a thickness of the second part.

According to still another feature of the present disclosure, the display device further includes a planarization layer disposed between the substrate and the adhesive layer, the planarization layer can include a concave portion overlapping the plurality of first parts and a convex portion overlapping the second part.

According to still another feature of the present disclosure, the planarization layer further includes an additional convex portion disposed on the convex portion and a thickness of a part of the adhesive layer overlapping the additional convex portion can be smaller than a thickness of a part of the adhesive layer overlapping the concave portion.

A method of manufacturing a display device according to an exemplary embodiment of the present disclosure includes transferring a plurality of light emitting diodes on a wafer onto a donor, placing a mask on an adhesive layer of the display panel and irradiating light thereon; and transferring the plurality of light emitting diodes on the donor onto the display panel, the adhesive layer is configured by a plurality of first parts overlapping the mask and a second part which is exposed from the mask to be irradiated with light and only a light emitting diode which is in contact with the plurality of first parts, among the plurality of light emitting diodes, can be transferred onto the display panel.

According to another feature of the present disclosure, the step of placing a mask on an adhesive layer of the display panel and irradiating light thereon can be a step of blocking light traveling to the plurality of first parts so as not to harden the plurality of first parts and irradiating light onto the second part to harden the second part.

According to still another feature of the present disclosure, the method can further include hardening the entire adhesive layer by irradiating light onto the adhesive layer, after transferring the plurality of light emitting diodes onto the display panel.

According to still another feature of the present disclosure, the plurality of first parts is thicker than the second part and the adhesiveness of the plurality of first parts is stronger than the adhesiveness of the second part.

According to still another feature of the present disclosure, prior to the step of placing a mask on an adhesive layer of the display panel and irradiating light thereon, the method further includes forming a planarization layer on a substrate of the display panel and forming an adhesive layer on the planarization layer. The planarization layer includes a concave portion overlapping the plurality of first parts and a convex portion overlapping the second part and a thickness of the planarization layer overlapping the concave portion can be smaller than a thickness of the planarization layer overlapping the convex portion.

According to still another feature of the present disclosure, the planarization layer can further include an additional convex portion disposed on the convex portion.

According to still another feature of the present disclosure, the display panel includes a plurality of sub pixels and the plurality of first parts of the adhesive layer can correspond to a plurality of sub pixels.

According to still another feature of the present disclosure, a plurality of light emitting diodes which is transferred onto the donor from the wafer forms a plurality of groups and in the step of transferring the plurality of light emitting diode on the donor onto the display panel, each of the plurality of groups can be disposed to overlap each of the plurality of sub pixels and an area adjacent to the plurality of sub pixels.

According to still another feature of the present disclosure, at least one of the plurality of light emitting diodes included in each of the plurality of groups can overlap the plurality of first parts and the remaining light emitting diode can overlap the second part.

According to still another feature of the present disclosure, the display panel further includes an additional sub pixel disposed between the plurality of sub pixels and a plurality of first parts of the adhesive layer can correspond to the additional sub pixel.

According to still another feature of the present disclosure, the method can further include: detecting a transfer defect of the plurality of light emitting diodes after transferring the plurality of light emitting diodes onto the display panel, transferring a light emitting diode onto an additional sub pixel adjacent to a sub pixel in which a transfer defect occurs, and hardening the entire adhesive layer.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The scope of the present invention can be interpreted by the appended claims and all the technical spirits in the equivalent range are intended to be embraced by the present disclosure.

What is claimed is:

1. A display device, comprising:

a substrate in which a pixel including a plurality of sub pixels is defined, an adhesive layer disposed on the substrate;

a plurality of light emitting diodes disposed on the adhesive layer in each of the plurality of sub pixels; and a reflection layer disposed between the substrate and the adhesive layer, wherein the adhesive layer is configured by a plurality of first parts overlapping the plurality of light emitting diodes and a second part which is a remaining part excluding the plurality of first parts, wherein an upper surface of the adhesive layer is flat and a thickness of the plurality of first parts is larger than a thickness of the second part, and wherein the reflection layer overlaps the plurality of first parts and the second part.

2. The display device according to claim 1, further comprising:

a planarization layer disposed between the substrate and the adhesive layer, wherein the planarization layer includes:

a concave portion overlapping the plurality of first parts and the plurality of light emitting diodes; and a convex portion overlapping the second part, and wherein a thickness of the concave portion is smaller than a thickness of the convex portion.

3. The display device according to claim 2, wherein the planarization layer further includes an additional convex portion disposed on the convex portion, and a thickness of a part of the adhesive layer overlapping the additional convex portion is smaller than a thickness of a part of the adhesive layer overlapping the concave portion.

4. The display device according to claim 1, further comprising:

a plurality of transistors disposed between the substrate and the reflection layer in each of the plurality of sub pixels.

5. The display device according to claim 1, further comprising:

a black bank disposed on the adhesive layer, wherein the black bank is disposed between the plurality of light emitting diodes.

6. The display device according to claim 1, wherein an adhesiveness of the plurality of first parts is stronger than an adhesiveness of the second part.

7. The display device according to claim 1, wherein the reflection layer overlapping both the plurality of first parts and the second part is integrally formed.

8. The display device according to claim 1, further comprising:

a driving transistor disposed on the substrate and electrically connected to a respective light emitting diode of the plurality of light emitting diodes, wherein the reflection layer is disposed between the driving transistor and the respective light emitting diode along a direction perpendicular to a top surface of the substrate.

9. The display device according to claim 8, wherein the reflection layer overlapping both the plurality of first parts and the second part is integrally formed.

10. The display device according to claim 8, further comprising a light shielding layer disposed between the substrate and an active layer of the driving transistor along the direction perpendicular to the top surface of the substrate.

11. The display device according to claim 8, wherein the reflection layer electrically connects the driving transistor to a respective light emitting diode of the plurality of light emitting diodes.

12. The display device according to claim 11, further comprising:

a planarization layer disposed between the driving transistor and the adhesive layer, wherein the planarization layer includes a concave portion overlapping a first part of the plurality of first parts and the respective light emitting diode of the plurality of light emitting diodes.

13. The display device according to claim 12, wherein a portion of the adhesive layer fills in part of the concave portion of the planarization layer.

14. The display device according to claim 11, further comprising a second connection electrode electrically connected to the respective light emitting diode, wherein the second connection electrode and the reflection layer electrically connect a source or drain electrode of the driving transistor to the respective light emitting diode.

15. The display device according to claim 12, wherein the planarization layer further includes a convex portion overlapping the second part, and wherein a thickness of the concave portion is smaller than a thickness of the convex portion.

16. The display device according to claim 15, wherein the planarization layer further includes an additional convex portion disposed on the convex portion, and a thickness of a part of the adhesive layer overlapping the additional convex portion is smaller than a thickness of a part of the adhesive layer overlapping the concave portion.

17. The display device according to claim 16, further comprising:

a black bank disposed on the adhesive layer, wherein the black bank is disposed between the plurality of light emitting diodes.

18. The display device according to claim 12, further comprising a passivation layer disposed between the adhesive layer and the planarization layer, wherein a portion of the passivation layer fills in part of the concave portion of the planarization layer.

19. The display device according to claim 12, further comprising a passivation layer disposed between the adhesive layer and the planarization layer, wherein a portion of both the adhesive layer and a portion of the passivation layer fill in part of the concave portion of the planarization layer.

* * * * *